(12) United States Patent
Sakaguchi et al.

(10) Patent No.: US 8,314,344 B2
(45) Date of Patent: Nov. 20, 2012

(54) WIRING BOARD AND MANUFACTURING METHOD OF THE SAME

(75) Inventors: Hideaki Sakaguchi, Nagano (JP); Akinori Shiraishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 369 days.

(21) Appl. No.: 12/573,256

(22) Filed: Oct. 5, 2009

(65) Prior Publication Data
US 2010/0089631 A1    Apr. 15, 2010

(30) Foreign Application Priority Data

Oct. 9, 2008  (JP) ................................ 2008-262322

(51) Int. Cl.
*H05K 1/16* (2006.01)
(52) U.S. Cl. ........................ 174/260; 174/262
(58) Field of Classification Search .................. None
See application file for complete search history.

(56) References Cited

U.S. PATENT DOCUMENTS

| | | | |
|---|---|---|---|
| 6,908,784 B1* | 6/2005 | Farnworth et al. | 438/106 |
| 7,183,191 B2* | 2/2007 | Kinsman et al. | 438/613 |
| 7,446,262 B2* | 11/2008 | Ogawa et al. | 174/255 |
| 2008/0179711 A1* | 7/2008 | Fujimoto et al. | 257/620 |

FOREIGN PATENT DOCUMENTS

| | | |
|---|---|---|
| JP | 2006-135174 A | 5/2006 |
| JP | 2007-019394 | 1/2007 |

OTHER PUBLICATIONS

Office Action dated Sep. 18, 2012 issued with respect to the basic Japanese Patent Application No. 2008-262322.

* cited by examiner

*Primary Examiner* — Ishwarbhai Patel
(74) *Attorney, Agent, or Firm* — IPUSA, PLLC

(57) ABSTRACT

A wiring board, includes a substrate main body; a piercing electrode configured to pierce the substrate main body; a first wiring pattern provided at a first surface side of the substrate main body, the first wiring pattern having a pad, the pad being electrically connected to one end part of the piercing electrode, the pad being where an electronic component is mounted; and a second wiring pattern provided at a second surface side of the substrate main body, the second surface side being situated at a side opposite to the first surface side, the second wiring pattern having an outside connection pad, the outside connection pad being electrically connected to another end part of the piercing electrode.

9 Claims, 33 Drawing Sheets

FIG.2 REALTED ART

US 8,314,344 B2

WIRING BOARD AND MANUFACTURING METHOD OF THE SAME

CROSS-REFERENCE TO RELATED APPLICATIONS

This patent application is based upon and claims the benefit of priority of Japanese Patent Application No. 2008-262322 filed on Oct. 9, 2008 the entire contents of which are incorporated herein by reference.

BACKGROUND OF THE INVENTION

1. Field of the Invention

The present invention generally relates to wiring boards and manufacturing methods of the same. More specifically, the present invention relates to a wiring board that includes a substrate main body and a pad where an electronic component is mounted and a manufacturing method of the same.

2. Description of the Related Art

Conventionally, a semiconductor device including an electronic component and a wiring board where the electronic component is mounted has been suggested. See, for example, FIG. 1.

FIG. 1 is a cross-sectional view of a related art semiconductor device.

Referring to FIG. 1, a related art semiconductor device 200 includes a wiring board 201, electronic components 202 and 203, and outside connection terminals 205 and 206.

The wiring board 201 includes a substrate main body 211, an insulation film 212, piercing electrodes 213 and 214, wiring patterns 216 through 218, 221, and 222, and solder resist layers 225 and 226.

Piercing holes 231 and 232 are formed in the substrate main body 211. For example, a silicon substrate, a compound semiconductor substrate such as GaAs, a glass substrate (including a quartz glass substrate), or the like can be used as the substrate main body 211.

The insulation film 212 is formed so as to cover an upper surface 211A and a lower surface 211B of the substrate main body 211 and a surface of the substrate main body 211 corresponding to side surfaces of the piercing holes 231 and 232.

The piercing electrode 213 is formed in the piercing hole 231 where the insulation film 212 is formed. The piercing electrode 214 is formed in the piercing hole 232 where the insulation film 212 is formed.

The wiring pattern 216 is formed on the insulation film 212 formed on the upper surface 211A of the substrate main body 211. The wiring pattern 216 is connected to an upper end of the piercing electrode 213. The wiring pattern 216 includes a pad 216A where the electronic component 203 is mounted.

The wiring pattern 217 is formed on the insulation film 212 formed on the upper surface 211A of the substrate main body 211. The wiring pattern 217 is connected to an upper end of the piercing electrode 214. The wiring pattern 217 includes a pad 217A where the electronic component 202 is mounted.

The wiring pattern 218 is formed on the insulation film 212 situated between the electronic components 202 and 203. One end of the wiring pattern 218 is connected to the pad 216A and another end of the wiring pattern 218 is connected to the pad 217A.

The wiring pattern 221 is provided on the insulation film 212 formed on the lower surface 211B of the substrate main body 211. The wiring pattern 221 is connected to a lower end of the piercing electrode 213. With this structure, the wiring pattern 221 is electrically connected to the wiring pattern 216 via the piercing electrode 213. The wiring pattern 221 includes an outside connection pad 221A.

The wiring pattern 222 is provided on the insulation film 212 formed on the lower surface 211E of the substrate main body 211. The wiring pattern 222 is connected to a lower end of the piercing electrode 214. With this structure, the wiring pattern 222 is electrically connected to the wiring pattern 217 via the piercing electrode 214. The wiring pattern 222 includes an outside connection pad 222A.

The solder resist layer 225 is provided on the insulation film 212 so as to cover portions of the wiring patterns 216 and 217 excluding the pads 216A and 217A and the wiring pattern 218. An opening part 225A exposing the pad 216A and the opening part 225B exposing the pad 217A are formed in the solder resist layer 225.

The solder resist layer 226 is provided on the lower surface of the insulation film 212 so as to cover portions of the wiring patterns 221 and 222 excluding the pads 221A and 222A. An opening part 226A exposing the pad 221A and the opening part 226B exposing the pad 222A are formed in the solder resist layer 226.

The electronic component 202 is flip-chip mounted on the pad 217A. The electronic component 203 is flip-chip mounted on the pad 216A. The electronic component 203 is electrically connected to the electronic component 202 via the wiring pattern 218.

The outside connection terminal 205 is provided on the outside connection pad 221A. The outside connection terminal 206 is provided on the outside connection pad 222A. The outside connection terminals 205 and 206 are electrically connected to pads (not shown) provided on a mounting board such as a mother board when the semiconductor device 200 is mounted on the mounting board. See, for example Japanese Laid-Open Patent Application Publication No. 2006-135174.

FIG. 2 is a view for explaining problems of the related art semiconductor device 200. In FIG. 2, parts that are the same as the parts of the semiconductor device 200 shown in FIG. 1 are given the same reference numerals, and explanation thereof is omitted.

In a case where the silicon substrate, the compound semiconductor substrate such as GaAs, the glass substrate (including a quartz glass substrate), or the like is used as the substrate main body 211, the substrate main body 211 is, compared to a resin substrate, easily damaged.

Because of this, as shown in FIG. 2, a corner part or an external circumferential part including the corner part of the substrate main body 211 may be damaged due to handling of the wiring board 201 (for example, handling between completion of manufacturing of the wiring board 201 and mounting of the electronic components 202 and 203 on the wiring board 201). This may result in a broken part 250.

SUMMARY OF THE INVENTION

Accordingly, embodiments of the present invention may provide a novel and useful wiring board and manufacturing method of the same solving one or more of the problems discussed above.

More specifically, the embodiments of the present invention may provide a wiring board and a manufacturing method of the same whereby a corner part or an external circumferential part (including the corner part) of a substrate main body is prevented from being damaged.

Another aspect of the present invention may be to provide a wiring board, including:
a substrate main body;
a piercing electrode configured to pierce the substrate main body;
a first wiring pattern provided at a first surface side of the substrate main body, the first wiring pattern having a pad, the pad being electrically connected to one end part of the piercing electrode, the pad being where an electronic component is mounted; and
a second wiring pattern provided at a second surface side of the substrate main body, the second surface side being situated at a side opposite to the first surface side, the second wiring pattern having an outside connection pad, the outside connection pad being electrically connected to another end part of the piercing electrode,
wherein a first recess part and a first resin configured to cover the first recess part are provided at a corner part of the wiring board facing the first surface side so as to surround the first wiring pattern, and the first recess part is configured to notch a first corner part of the substrate main body positioned at the first surface side.

Another aspect of the present invention may be to provide a wiring board, including:
a substrate main body;
a piercing electrode configured to pierce the substrate main body;
a first wiring pattern provided at a first surface side of the substrate main body, the first wiring pattern having a pad, the pad being electrically connected to one end part of the piercing electrode, the pad being where an electronic component is mounted; and
a second wiring pattern provided at a second surface side of the substrate main body, the second surface side being situated at a side opposite to the first surface side, the second wiring pattern having an outside connection pad, the outside connection pad being electrically connected to another end part of the piercing electrode,
wherein a recess part and a resin configured to cover the recess part are provided at an external circumferential part of the wiring board so as to surround the first wiring pattern, the second wiring pattern, and the piercing electrode, the recess part being configured to pierce the substrate main body of a part positioned at the external circumferential part of the wiring board.

Another aspect of the present invention may be to provide a manufacturing method of a wiring board, including:
a substrate main body preparing step of preparing a substrate main body, the substrate main body having a plurality of wiring board forming areas and a plurality of cutting areas, the cutting areas being provided so as to surround the plural wiring board forming areas;
a piercing electrode and wiring pattern forming step of forming a piercing electrode, a first wiring pattern, and a second wiring pattern in the plural wiring board forming areas, the piercing electrode being configured to pierce the substrate main body, the first wiring pattern having a pad, the pad being electrically connected to one end part of the piercing electrode, the pad being where an electronic component is mounted, the second wiring pattern having an outside connection pad, the outside connection pad being electrically connected to another end part of the piercing electrode;
an insulation resin layer forming step of forming a first insulation resin layer and a second insulation resin layer, the first insulation resin layer having an opening part where the pad is exposed, the first insulation resin layer being configured to cover a part of the first wiring pattern excluding the pad, the second insulation resin layer having an opening part where the outside connection pad is exposed, the second insulation resin layer being configured to cover a part of the second wiring pattern excluding the outside connection pad;
a first groove part forming step of forming, after the insulation resin layer forming step, a first groove part in the first insulation resin layer and the substrate main body of the cutting area and portions of the plural wiring forming areas neighboring the cutting areas, the first groove part having a width greater than a width of the cutting area;
a first resin forming step of forming a first resin filling the first groove part; and
a cutting step of cutting a part corresponding to the cutting area of the substrate main body, the second insulation resin layer, and the first resin filling in the first groove, so that pieces of the plural wiring boards formed in the plural wiring forming areas are made, and thereby a first recess part and the first resin configured to cover the first recess part are formed at a corner part of the wiring board positioned at a side where the first insulation resin layer is formed so as to surround the first wiring pattern, the first recess part being configured to notch a first corner part of the substrate main body.

Another aspect of the present invention may be to provide a manufacturing method of a wiring board, including:
a substrate main body preparing step of preparing a substrate main body, the substrate main body having a plurality of wiring board forming areas and a plurality of cutting areas, the cutting areas being provided so as to surround the plural wiring board forming areas;
a piercing electrode and wiring pattern forming step of forming a piercing electrode, a first wiring pattern, and a second wiring pattern in the plural wiring board forming areas, the piercing electrode being configured to pierce the substrate main body, the first wiring pattern having a pad, the pad being electrically connected to one end part of the piercing electrode, the pad being where an electronic component is mounted, the second wiring pattern having an outside connection pad, the outside connection pad being electrically connected to another end part of the piercing electrode;
an insulation resin layer forming step of forming a first insulation resin layer and a second insulation resin layer, the first insulation resin layer having an opening part where the pad is exposed, the first insulation resin layer being configured to cover a part of the first wiring pattern excluding the pad, the second insulation resin layer having an opening part where the outside connection pad is exposed, the second insulation resin layer being configured to cover a part of the second wiring pattern excluding the outside connection pad;
a piercing groove part forming step of forming, after the insulation resin layer forming step, a piercing groove part in the first insulation resin layer, the second wiring pattern, and the substrate main body of the cutting area and portions of the plural wiring forming areas neighboring the cutting areas, the piercing groove part having a width greater than a width of the cutting area;
a resin forming step of forming a resin filling the piercing groove part; and
a cutting step of cutting a part corresponding to the cutting area of the resin, so that pieces of the plural wiring boards are made, and thereby a recess part is formed at the external circumferential part of the wiring board so as to surround the first and the second wiring patterns and the piercing electrode, the recess part being covered with the resin.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 3 through FIG. 33 of embodiments of the present invention. In the following explanation, a semiconductor device may be called as a semiconductor package.

First Embodiment

Figure 1:
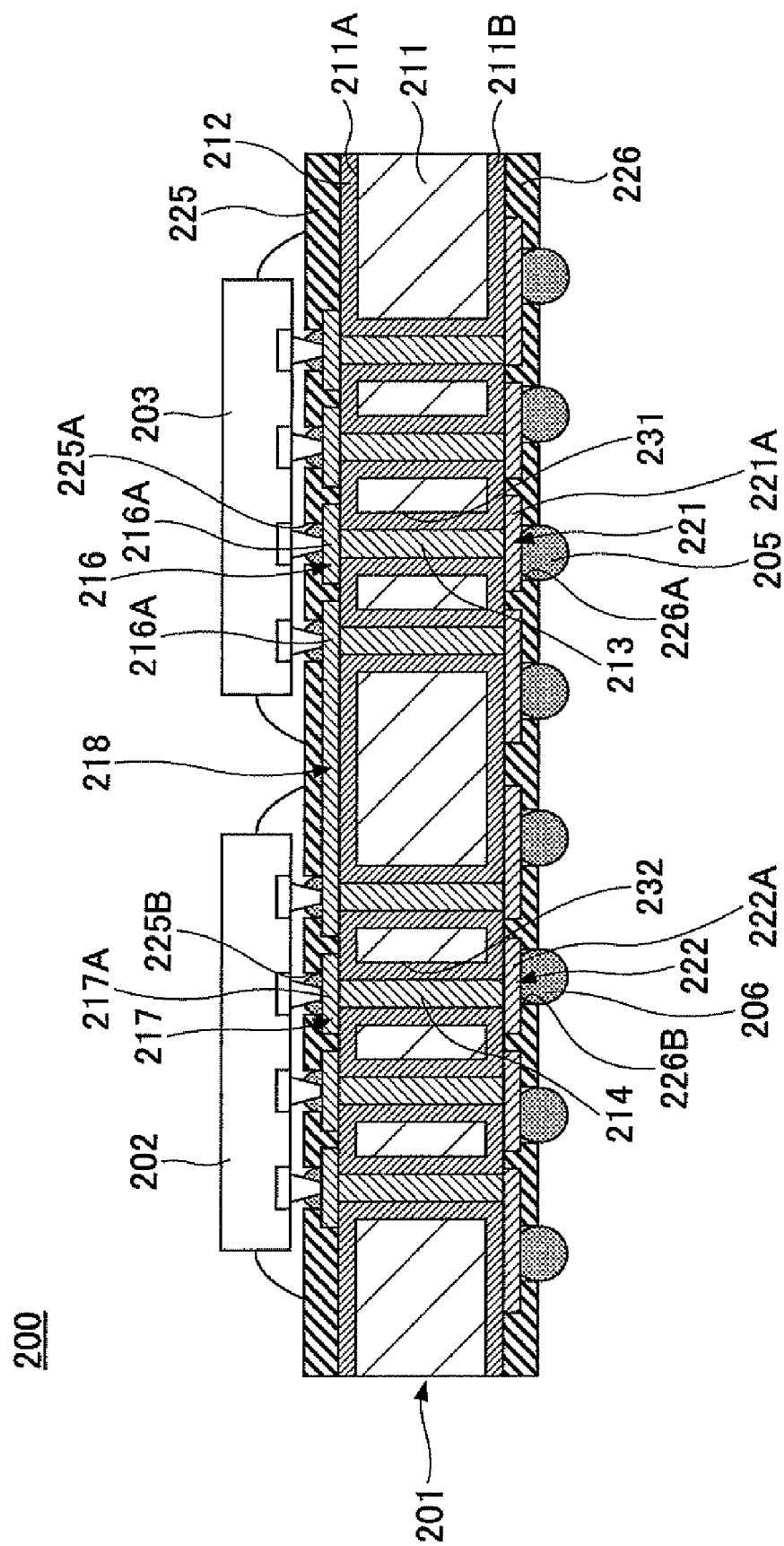
FIG. 1 is a cross-sectional view of a related art semiconductor device.
Figure 2:
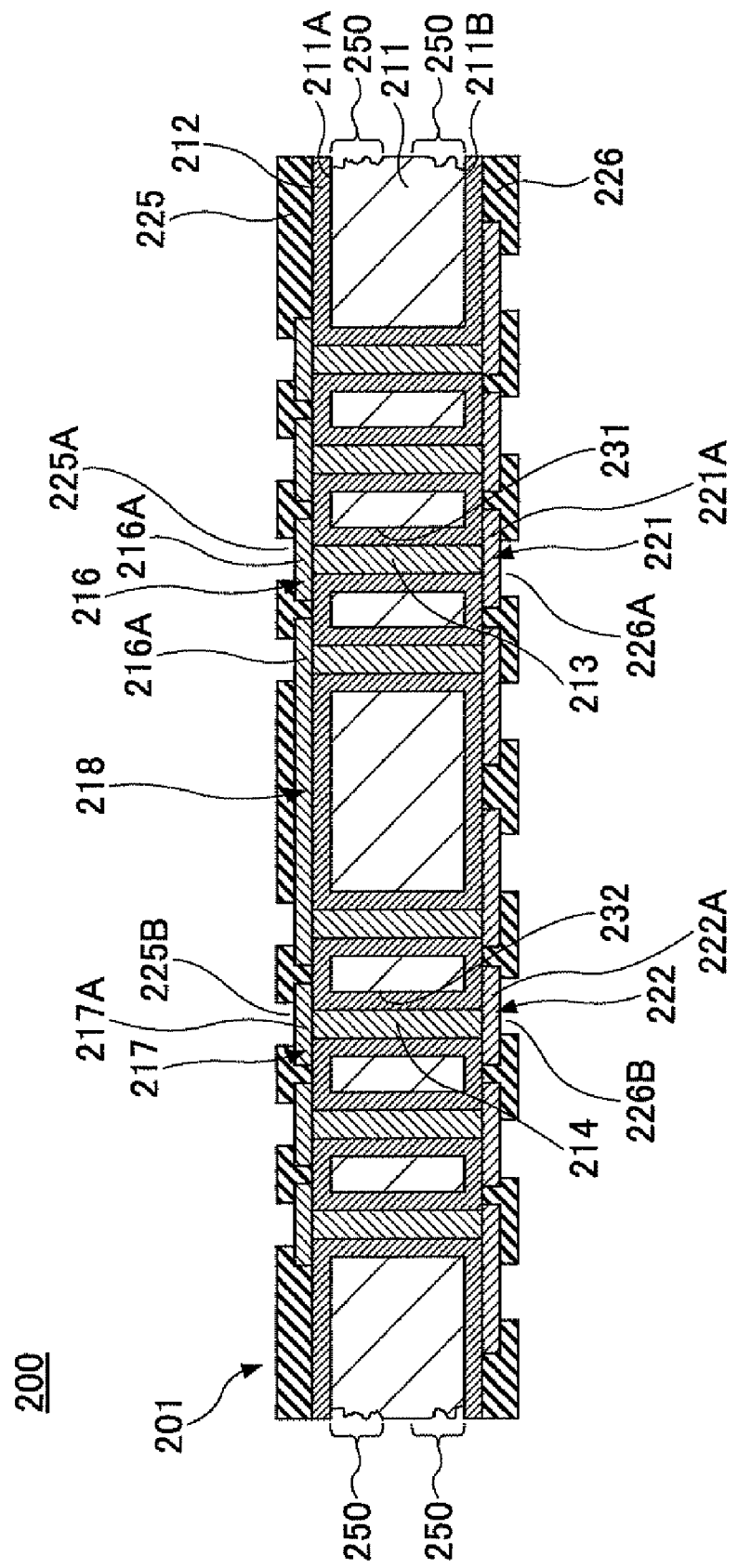
FIG. 2 is a view for explaining problems of the related art semiconductor device.
Figure 3:
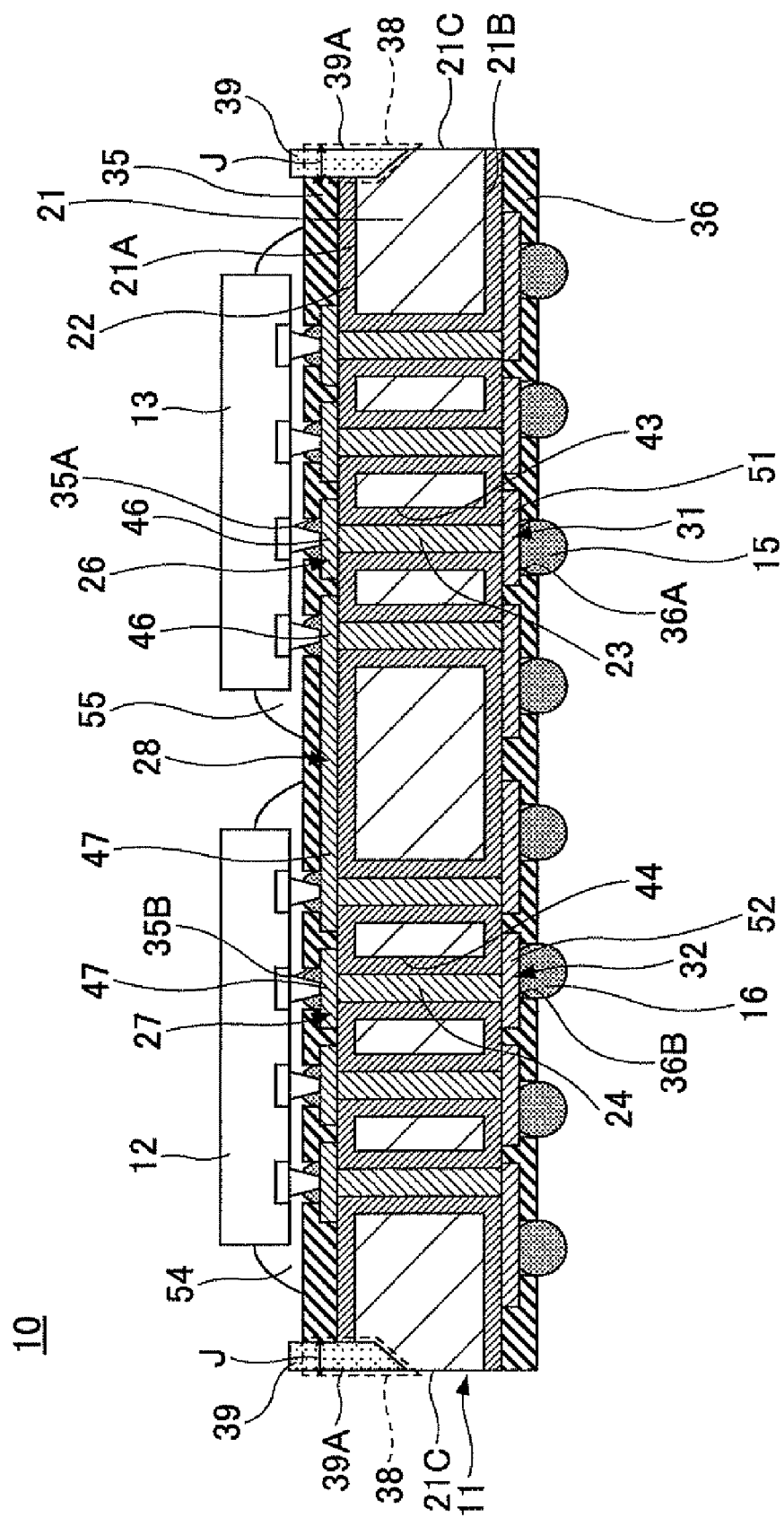
FIG. 3 is a cross-sectional view of a semiconductor device of a first embodiment of the present invention.

FIG. 3 is a cross-sectional view of a semiconductor device of a first embodiment of the present invention.

Referring to FIG. 3, a semiconductor device 10 of the first embodiment of the present invention includes a wiring board 11, electronic components 12 and 13, and outside connection terminals 15 and 16.

The wiring board 11 includes a substrate main body 21, an insulation film 22, piercing electrodes 23 and 24, first wiring patterns 26 and 27, a wiring pattern 28, second wiring patterns 31 and 32, a first insulation resin layer 35, a second insulation resin layer 36, a recess part 38 as a first recess part, and resin 39 as first resin.

Piercing holes 43 and 44 are formed in the substrate main body 21 having a plate-shaped configuration. For example, a silicon substrate, a compound semiconductor substrate such as GaAs, a glass substrate (including a quartz glass substrate), or the like can be used as the substrate main body 21. In a case where the silicon substrate is used as the substrate main body 21, the thickness of the substrate main body 21 may be, for example, approximately 200 µm. In this embodiment, the case where the silicon substrate is used as the substrate main body 21 is discussed an example.

The insulation film 22 is formed so as to cover an upper surface (first surface) 21A and a lower surface (second surface) 21B of the substrate main body 21 and a surface of the substrate main body 21 corresponding to side surfaces of the piercing holes 43 and 44. For example, a thermal oxidation film or an oxidation film (for example, an oxidation film formed by a CVD method) is used as the insulation film 22. More specifically, for example, $SiO_2$ film is used as the insulation film 22. In a case where the thermal oxidation film or the oxidation film is used as the insulation film 22, the thickness of the insulation film 22 may be, for example, approximately 1 μm.

The piercing electrode 23 is formed in the piercing hole 43 where the insulation film 22 is formed. The piercing electrode 24 is formed in the piercing hole 44 where the insulation film 22 is formed. The piercing electrodes 23 and 24 may be formed by, for example, a plating method. Cu, for example, may be used as materials of the piercing electrodes 23 and 24.

The first wiring pattern 26 is formed on the insulation film 22 formed on the upper surface 21A of the substrate main body 21. The first wiring pattern 26 is connected to an upper end of the piercing electrode 23. The wiring pattern 26 includes a pad 46 where the electronic component 13 is mounted.

The first wiring pattern 27 is formed on the insulation film 22 formed on the upper surface 21A of the substrate main body 21. The first wiring pattern 27 is connected to an upper end of the piercing electrode 24. The first wiring pattern 27 includes a pad 47 where the electronic component 12 is mounted.

The wiring pattern 28 is formed on the insulation film 22 situated between the electronic components 12 and 13. One end of the wiring pattern 28 is connected to the pad 46 and another end of the wiring pattern 28 is connected to the pad 47.

The first wiring patterns 26 and 27 and the wiring pattern 28 having the above-discussed structures are formed by, for example, a semi-additive method. In addition, for example, Cu may be used as a material of the first wiring patterns 26 and 27 and the wiring pattern 28.

The second wiring pattern 31 is provided on a lower surface of the insulation film 22 formed on the lower surface 21B of the substrate main body 21. The second wiring pattern 31 is connected to a lower end of the piercing electrode 23. With this structure, the second wiring pattern 31 is electrically connected to the first wiring pattern 26 via the piercing electrode 23. The second wiring pattern 31 includes an outside connection pad 51 where the outside connection terminal 15 is provided.

The second wiring pattern 32 is provided on the lower surface of the insulation film 22 formed on the lower surface 21B of the substrate main body 21. The second wiring pattern 32 is connected to a lower end of the piercing electrode 24. With this structure, the second wiring pattern 32 is electrically connected to the first wiring pattern 27 via the piercing electrode 24. The second wiring pattern 32 includes an outside connection pad 52 where the outside connection terminal 16 is provided.

The second wiring patterns 31 and 32 having the above-discussed structures are formed by, for example, a semi-additive method. In addition, for example, Cu may be used as a material of the second wiring patterns 31 and 32.

The first insulation resin layer 35 is provided on the insulation film 22 so as to cover portions of the first wiring patterns 26 and 27 excluding the pads 46 and 47 and the wiring pattern 28. An opening part 35A exposing the pad 46 and the opening part 35B exposing the pad 47 are formed in the first insulation resin layer 35. For example, a solder resist layer can be used as the first insulation resin layer 35.

The second insulation resin layer 36 is provided on the lower surface of the insulation film 22 so as to cover portions of the second wiring patterns 31 and 32 excluding the pads 51 and 52. An opening part 36A exposing the pad 51 and the opening part 36B exposing the pad 52 are formed in the second insulation resin layer 36. For example, a solder resist later can be used as the second insulation resin layer 36.

The recess part 38 is provided at the corner part of the wiring board 11, the corner part being positioned at the upper surface 21A side of the substrate main body 21. More specifically, the recess part 38 is formed at a first corner part, namely a corner part positioned at the upper surface 21A side of the substrate main body 21, and at the insulation film 22 and the first insulation resin layer 35 positioned in the vicinity of the corner part of the substrate main body 21. The recess part 38 is formed to notch the corner part positioned at the upper surface 21A side of the substrate main body 21, and at the insulation film 22 and the first insulation resin layer 35 positioned in the vicinity of the corner part of the substrate main body 21.

The recess part 38 has a frame-shaped planar configuration which surrounds the first wiring patterns 26 and 27 and the wiring pattern 28. A portion of the recess part 38 formed in the substrate main body 21 has a cross-sectional configuration where width is becomes narrower while moving from the upper surface 21A of the substrate main body 21 to the lower surface 21B of the substrate main body 21. In other words, a lower end of the recess part 38 has an acuminate-shaped (wedge-shaped) configuration. A width J of a portion not having the acuminate-shaped (wedge-shaped) configuration of the recess part 38 may be, for example, approximately 30 μm.

The recess part 38 can be formed by, for example, a dicer or laser processing. In a case where the recess part 38 is formed by the dicer, for example, a dicing blade whose head end has an acuminate-shaped (wedge-shaped) configuration can be used.

The resin 39 is provided so as to cover (fill in) the recess part 38. The resin 39 has a cross section substantially the same as that of the recess part 38. An upper part of the resin 39 projects from an upper surface of the first insulation resin layer 35. The resin 39 is configured to protect a portion of the substrate main body 21 exposed by the recess part 38, more specifically, the corner part of the substrate main body 21 positioned at the upper surface 21A side.

Thus, the recess part 38 is formed at the corner part of the wiring board 11, the corner part being positioned at the upper surface 21A side of the substrate main body 21 so as to surround the first wiring patterns 26 and 27. In addition, the recess part 38 is configured to notch the corner part of the substrate main body 21. Furthermore, the resin 39 is configured to cover the recess part 38. Hence, by providing the recess part 38 and the resin 39, it is possible to protect, with the resin 39, the corner part of the substrate main body 21 which may be easily damaged. With this structure, it is possible to prevent the corner part of the substrate main body 21 positioned at the upper surface 21A side of the substrate main body 21 from being damaged due to handling of the wiring board 11 (for example, handling between completion of manufacturing of the wiring board 11 and mounting of the electronic components 12 and 13 on the wiring board 11).

As the resin 39, for example, epoxy resin, polyimide resin, silicone resin, or the like can be used. A side surface 39A of the resin 39 is situated at the same surface as an external circumferential side surface 21C of the substrate main body 21.

Thus, by providing the resin 39 at the recess part 38 so that the side surface 39A of the resin 39 is situated at the same surface as the external circumferential side surface 21C of the substrate main body 21, it is possible to avoid making the size in a surface direction of the wiring board 11 large.

The electronic component 12 is flip-chip mounted on the pad 47 provided on the wiring board 11. Underfill resin 54 is provided in a gap between the electronic component 12 and the wiring board 11. The electronic component 13 is flip-chip mounted on the pad 46 provided on the wiring board 11. The electronic component 13 is electrically connected to the electronic component 12 via the wiring pattern 28. Underfill resin 55 is provided in a gap between the electronic component 13 and the wiring board 11. For example, semiconductor chips can be used as the electronic components 12 and 13.

The outside connection terminal 5 is provided on the outside connection pad 51. The outside connection terminal 16 is provided on the outside connection pad 52. The outside connection terminals 15 and 16 are electrically connected to pads (not shown) provided on a mounting board such as a motherboard when the semiconductor device is mounted on the mounting board. Solder balls, for example, may be used as the outside connection terminals 15 and 16.

According to the wiring board 11 of this embodiment, the recess part 38 is formed at the corner part of the wiring board 11, the corner part being positioned at the upper surface 21A side of the substrate main body 21 so as to surround the first wiring patterns 26 and 27. In addition, the recess part 38 is configured to notch the corner part of the substrate main body 21. Furthermore, the resin 39 is configured to cover the recess part 38. Hence, by providing the recess part 38 and the resin 39, it is possible to protect, with the resin 39, the corner part of the substrate main body 21 which may be easily damaged. With this structure, it is possible to prevent the corner part of the substrate main body 21 positioned at the upper surface 21A side of the substrate main body 21 from being damaged due to handling of the wiring board 11 (for example, handling between completion of manufacturing of the wiring board 11 and mounting of the electronic components 12 and 13 on the wiring board 11).

In addition, by providing the resin 39 at the recess part 38 so that the side surface 39A of the resin 39 is situated at the same surface as the external circumferential side surface 21C of the substrate main body 21, it is possible to avoid making the size in a surface direction of the wiring board 11 large.

In a case where the glass substrate is used as the substrate main body 21, it is not necessary to provide the insulation film 22 because the glass substrate is an insulator.

Figure 4:
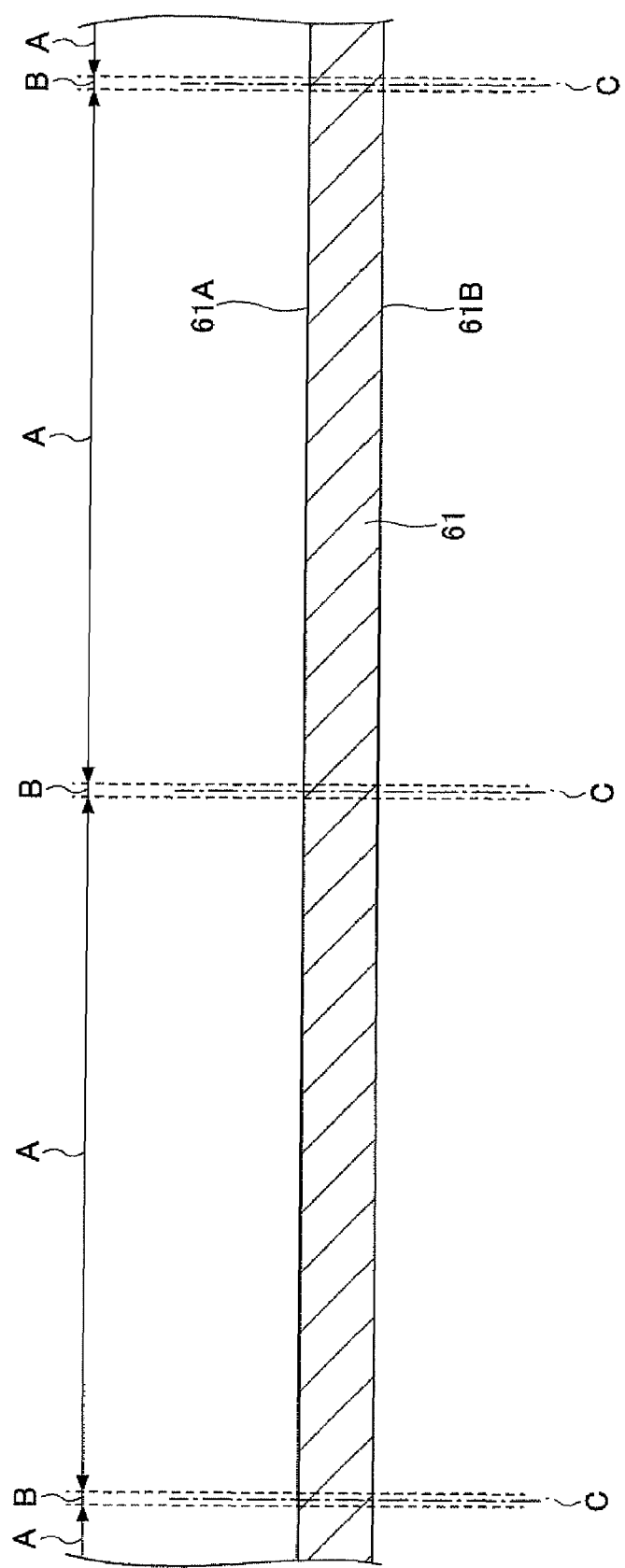
FIG. 4 is a first view showing a manufacturing process of a wiring board of the first embodiment of the present invention.

In the meantime, FIG. 4 through FIG. 12 are views showing the manufacturing process of the wiring board of the first embodiment of the present invention. FIG. 13 is a plan view of a structure shown in FIG. 4. In FIG. 4 through FIG. 12, parts that are the same as the parts of the wiring board 11 of the first embodiment are given the same reference numerals, and explanation thereof is omitted. In addition, in FIG. 13, parts that are the same as the parts of the structure shown in FIG. 4 are given the same reference numerals, and explanation thereof is omitted.

The manufacturing method of the wiring board 11 of the first embodiment of the present invention is discussed with reference to FIG. 4 through FIG. 13. First, in a step shown in FIG. 4, a substrate main body 61 is prepared (substrate main body preparing step). The substrate main body 61 includes plural wiring board forming areas A and plural cutting areas B, the cutting areas B being arranged so as to surround the wiring board forming areas A.

The wiring board forming area A is where the wiring board 11 is formed. The cutting area B is where the substrate main body 61 is cut in a step shown in FIG. 11. The substrate main body 61 is cut in the step shown in FIG. 11 so as to form plural of the substrate main bodies 21 having rectangular-shaped configurations. The substrate main body 21 is one of the structural elements of the wiring board 11. For example, a silicon substrate, a compound semiconductor substrate such as GaAs, a glass substrate (including a quartz glass substrate), or the like can be used as the substrate main body 21. In the following explanations, a case where the silicon substrate is used as the substrate main body 21 is discussed as an example. In the case where the silicon substrate is used as the substrate main body 61, the thickness of the substrate main body 61 may be, for example, approximately 200 μm.

Figure 5:
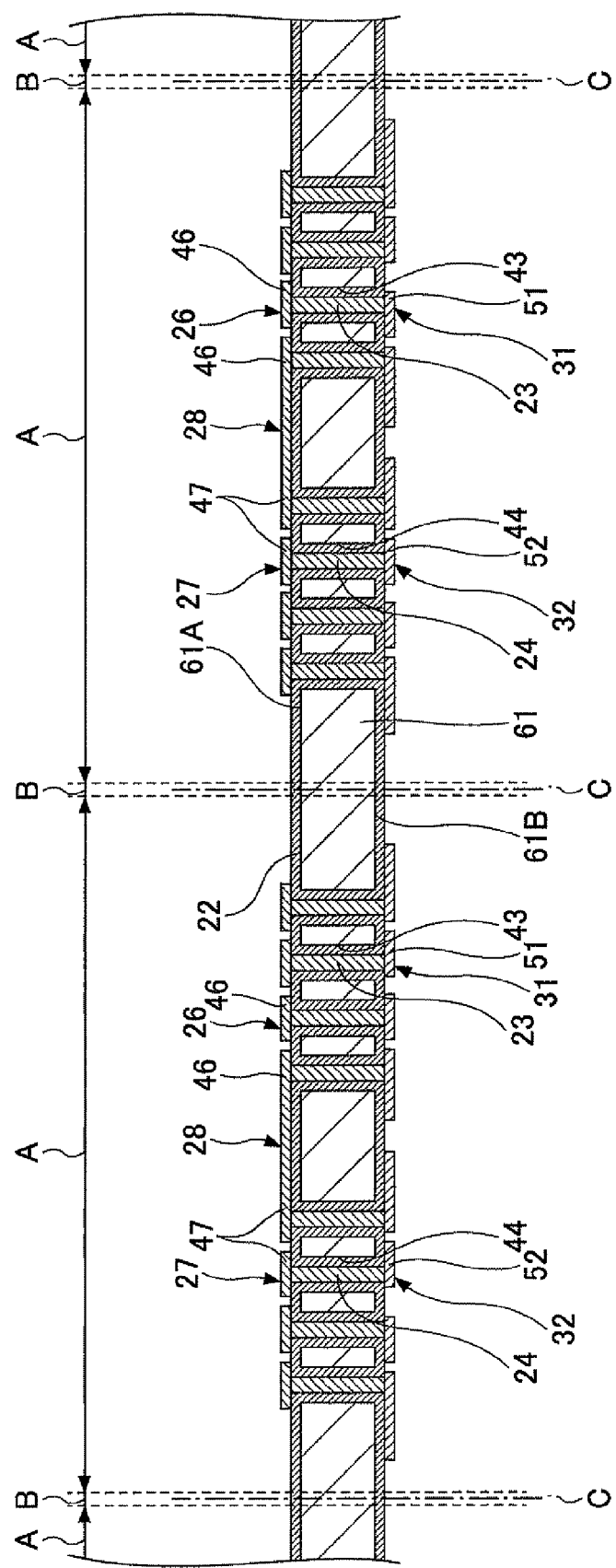
FIG. 5 is a second view showing the manufacturing process of the wiring board of the first embodiment of the present invention.

Next, in a step shown in FIG. 5, by a known method, the piercing holes 43 and 44 are formed in the wiring board forming areas A. Then, the insulation film 22 is formed so that an upper surface 61A and a lower surface 61B of the substrate main body 61 and a surface of the substrate main body 61 corresponding to side surfaces of the piercing holes 43 and 44 are covered with the insulation film 22. Next, the piercing electrodes 23 and 24 are formed in the piercing holes 43 and 44. After that, the first wiring patterns 26 and 27, the wiring pattern 28, and the second wiring patterns 31 and 32 are formed (piercing electrode and wiring pattern forming step).

More specifically, the piercing holes 43 and 44 may be formed by, for example, an etching method, laser processing, or the like. In a case where the glass substrate is used as the substrate main body 61, the piercing holes 43 and 44 may be formed by, for example, wet etching, sandblasting, mechanical processing, or the like. In addition, when the glass substrate is used as the substrate main body 61, it is not necessary to provide the insulation film 22.

As the insulation film 22, for example, a thermal oxidation film, an oxidation film, or the like can be used. In this case, the insulation film 22 can be formed by a thermal oxidizing method, a CVD method, or the like. The piercing electrodes 23 and 24, the first wiring patterns 26 and 27, the wiring pattern 28, and the second wiring patterns 31 and 32 can be formed by, for example, a semi-additive method. In addition, for example, Cu may be used as a material of the piercing electrodes 23 and 24, the first wiring patterns 26 and 27, the wiring pattern 28, and the second wiring patterns 31 and 32.

Figure 6:
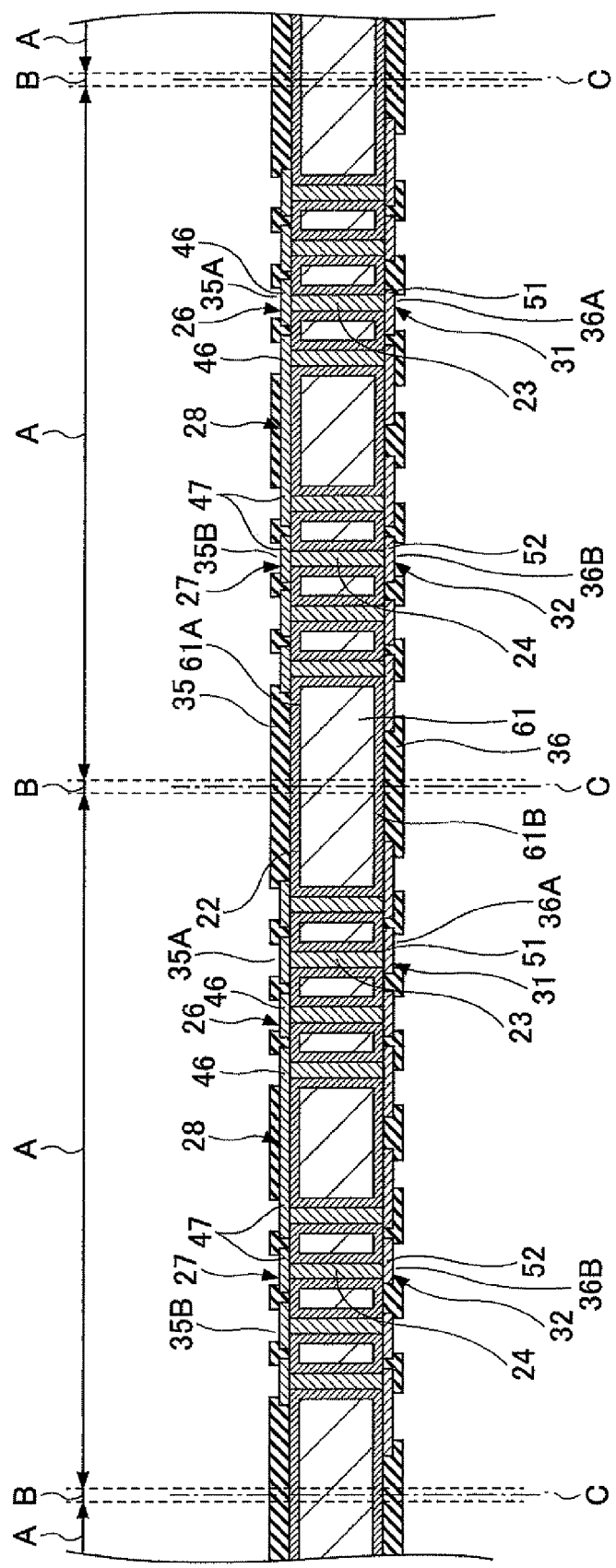
FIG. 6 is a third view showing the manufacturing process of the wiring board of the first embodiment of the present invention.

Next, in a step shown in FIG. 6 (insulation resin forming step), by a known method, the first insulation resin layer 35 is formed on the insulation film 22 formed on the upper surface 61A of the substrate main body 61. The first insulation resin layer 35 includes the opening parts 35A and 35B which expose the pads 46 and 47. In addition, the second insulation resin layer 36 is formed on the insulation film 22 formed on the lower surface 61B of the substrate main body 61. The second insulation resin layer 36 includes the opening parts 36A and 36B which expose the pads 51 and 52. For example, solder resist layers can be used as the first insulation resin layer 35 and the second insulation resin layer 36.

Figure 7:
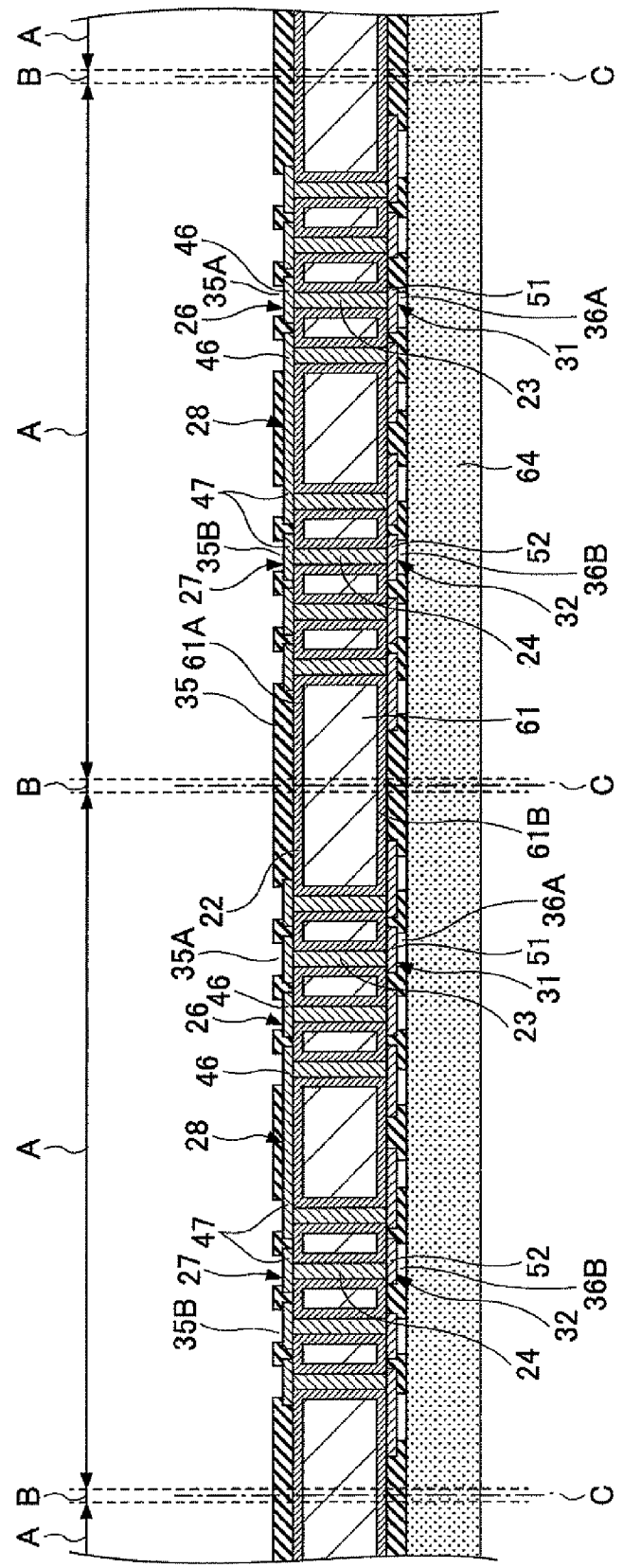
FIG. 7 is a fourth view showing the manufacturing process of the wiring board of the first embodiment of the present invention.

Next, in a step shown in FIG. 7, a dicing tape 64 is adhered to a lower surface side (a side where the second insulation resin layer 36 is formed) of the structure shown in FIG. 6. The thickness of the dicing tape 64 may be, for example, approximately 300 μm.

Figure 8:
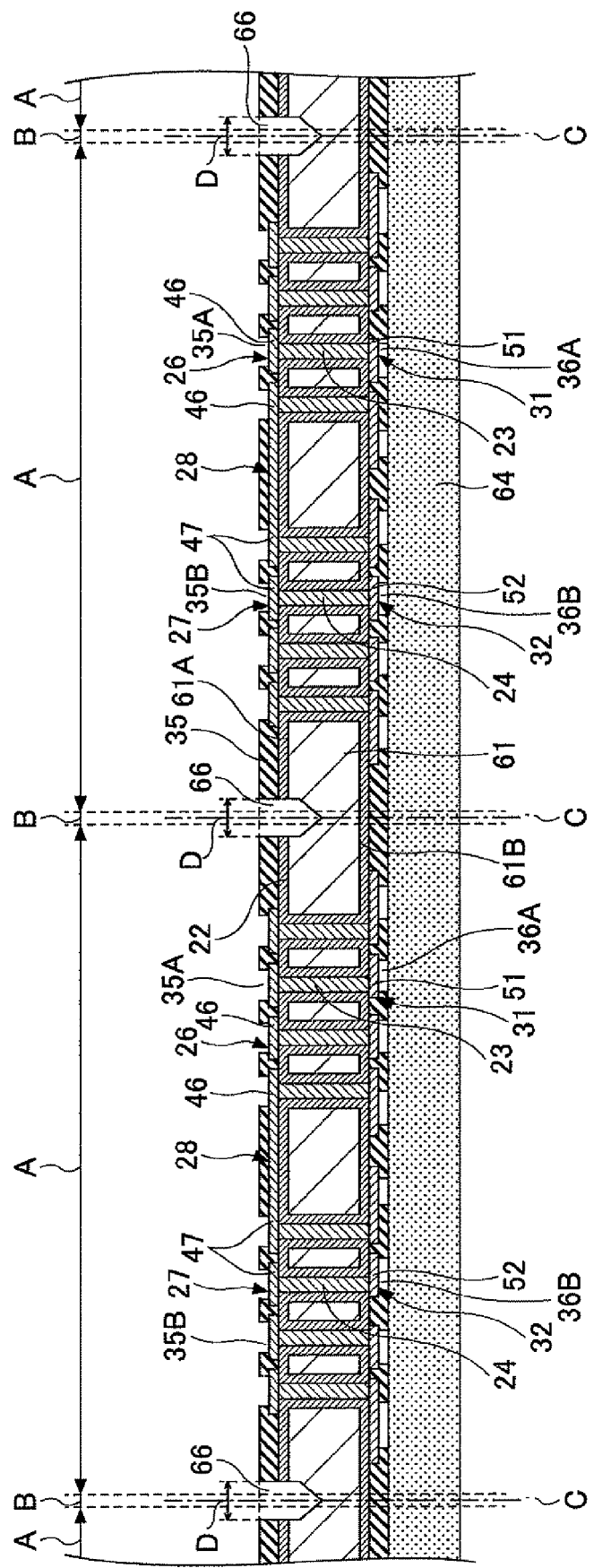
FIG. 8 is a fifth view showing the manufacturing process of the wiring board of the first embodiment of the present invention.

Next, in a step shown in FIG. 8 (first groove part forming step), a groove part (first groove part) 66 is formed in portions of the first insulation resin layer 35, the insulation film 22, and the substrate main body 61 corresponding to the cutting areas B and portions of the wiring forming areas A neighboring the cutting areas B. The width of the groove part 66 is greater than the width of the cutting area B.

At this time, the groove part 66 may be formed in a bilateral symmetrical manner with respect to a center line C of the cutting area B. The groove part 66 can be formed by, for example, a dicer or laser processing. In a case where the groove part 66 is formed by the dicer, for example, a dicing blade whose head end has an acuminate-shaped (wedge-shaped) configuration can be used.

The groove part 66 is cut in a step shown in FIG. 11 so that the recess part 38 (one of the structural elements of the wiring board 11) discussed with reference to FIG. 3 is formed. In a case where the width of the cutting area B is, for example, approximately 40 μm, a width D of the groove part 66 may be, for example, approximately 100 μm. In this case, a depth of the groove part 66 may be, for example, approximately 100 μm.

Figure 9:
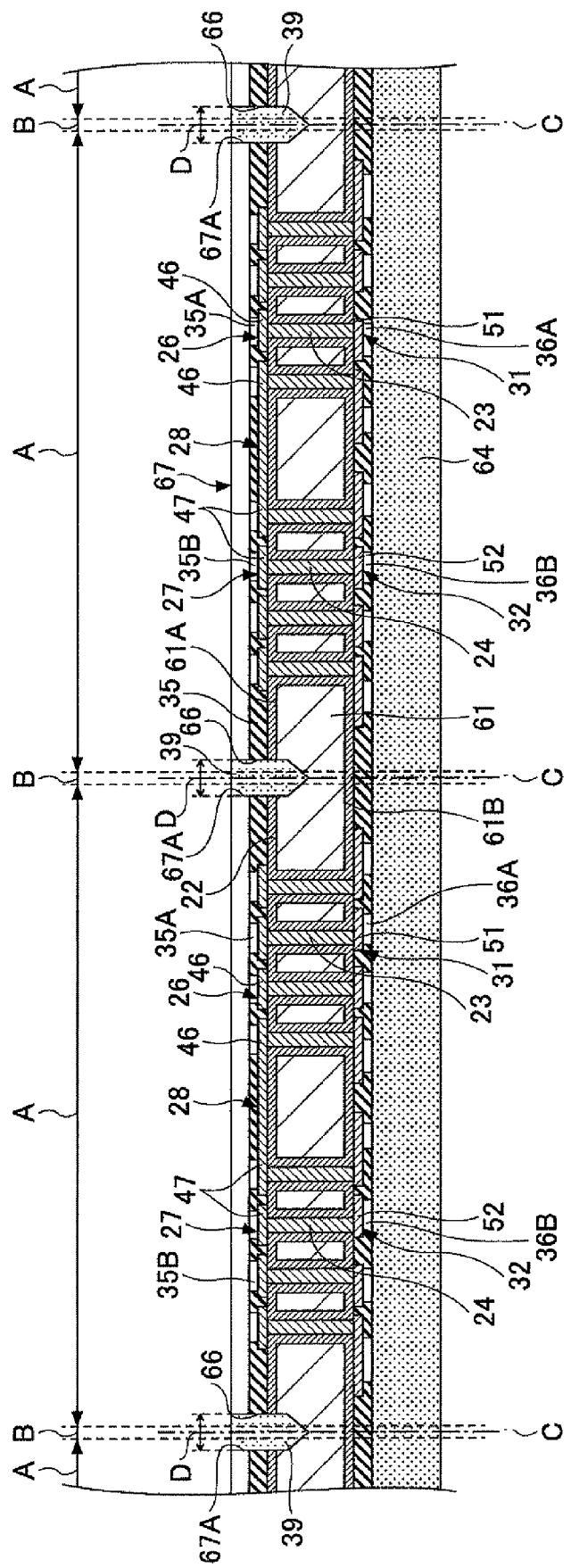
FIG. 9 is a sixth view showing the manufacturing process of the wiring board of the first embodiment of the present invention.

Next, in a step shown in FIG. 9 (first resin forming step), a stencil mask 67 is mounted on the first insulation resin layer 35. A piercing groove part 67A is formed in a portion of the stencil mask 67 facing the groove part 66. After that, by a printing method, the resin (first resin) 39 is supplied in the groove part 66.

At this time, the resin 39 is formed in the piercing groove part 67A. The resin 39 shown in FIG. 9 is a base material of the resin 39 discussed in reference to FIG. 3. As the resin 39, for example, epoxy resin, polyimide resin, silicone resin, or the like can be used. At this stage, the resin 39 is not completely cured. In other words, the resin 39 is in a semi-cured state. The width of the piercing groove part 67A is substantially equal to the width of the groove part 66. In a case where the width of the groove part 66 is approximately 100 μm, the width of the piercing groove part 67A may be, for example, approximately 100 μm. The thickness of the stencil mask 67 may be, for example, approximately 30 μm.

Figure 10:
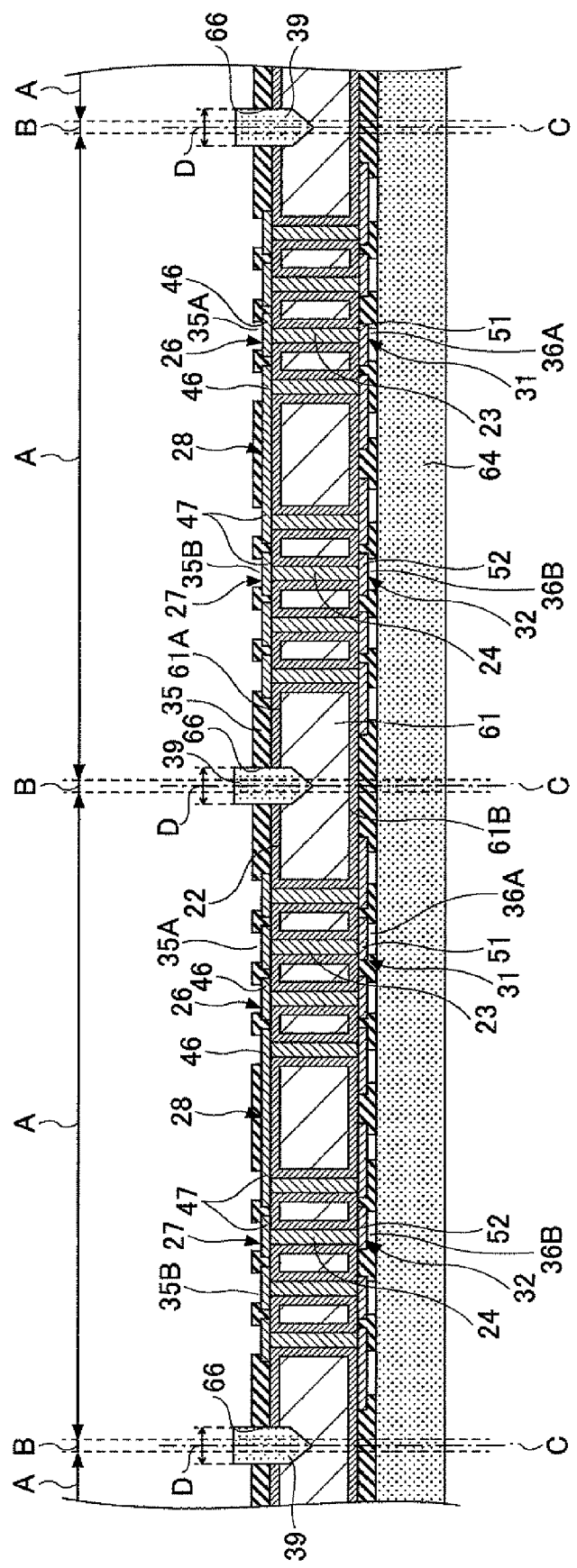
FIG. 10 is a seventh view showing the manufacturing process of the wiring board of the first embodiment of the present invention.

Next, in a step shown in FIG. 10, after the stencil mask 67 shown in FIG. 9 is removed, the resin 39 in the semi-cure state shown in FIG. 9 is completely cured. In a case where the resin 69 is thermosetting epoxy resin, the resin 39 is completely cured by, for example heating the resin 39 in the semi-cured state at approximately 160° C. The completely cured resin 39 is cut in the step shown in FIG. 11 so that the resin 39 shown in FIG. 3 (one of the structural elements of the wiring board 11) is formed.

Figure 11:
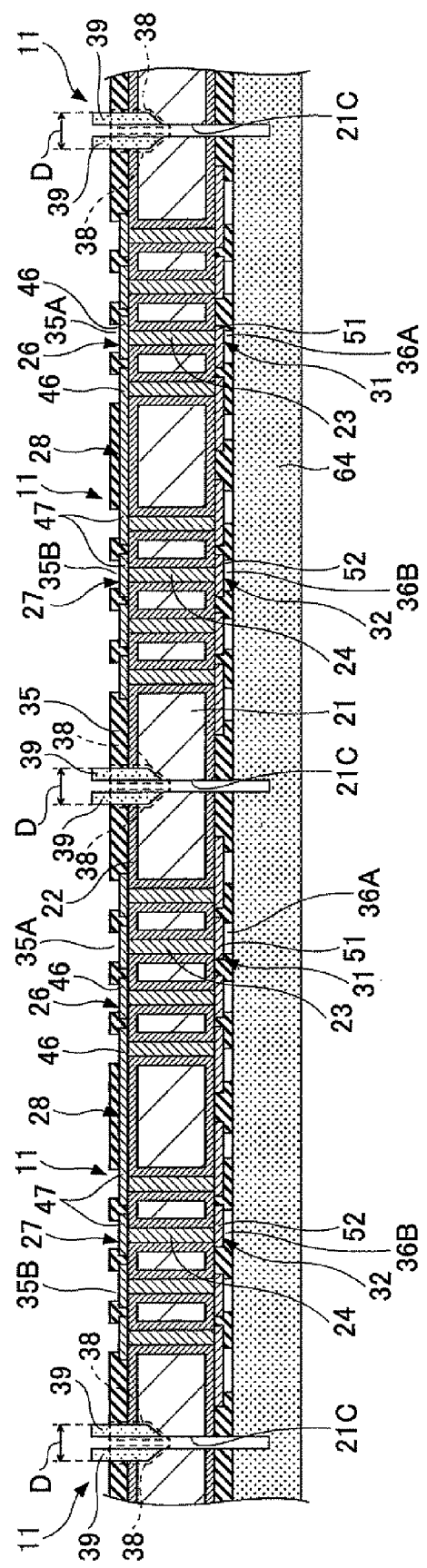
FIG. 11 is an eighth view showing the manufacturing process of the wiring board of the first embodiment of the present invention.

Next, in a step shown in FIG. 11 (cutting step), in the structure shown in FIG. 10, the substrate main body 61, the insulation film 22, the second insulation resin layer 36, and the resin 39 of a portion corresponding to the cutting area B are cut so that pieces of plural wiring boards 11 formed in plural wiring forming areas A can be made. As a result of this, the recess part 38 configured to notch the first corner part of the substrate main body 21 is formed at the corner part of the wiring board 11 positioned at the side where the first insulation resin layer 35 is formed so as to surround the first wiring patterns 26 and 27. The completely cured resin 39 is configured to cover the recess part 38. At this time, the width D of the groove part 66 is greater than the width of the cutting area B. Accordingly, the resin 39 remains in the recess parts 38 provided in the plural separated wiring boards 11 on the dicing tape 64. The substrate main body 61, the insulation film 22, the second insulation resin layer 36, and the resin 39 of a portion corresponding to the cutting area B can be cut by, for example, a dicer, laser processing, or the like. At this stage, separated plural wiring boards 11 are adhered to the dicing tape 64.

Figure 12:
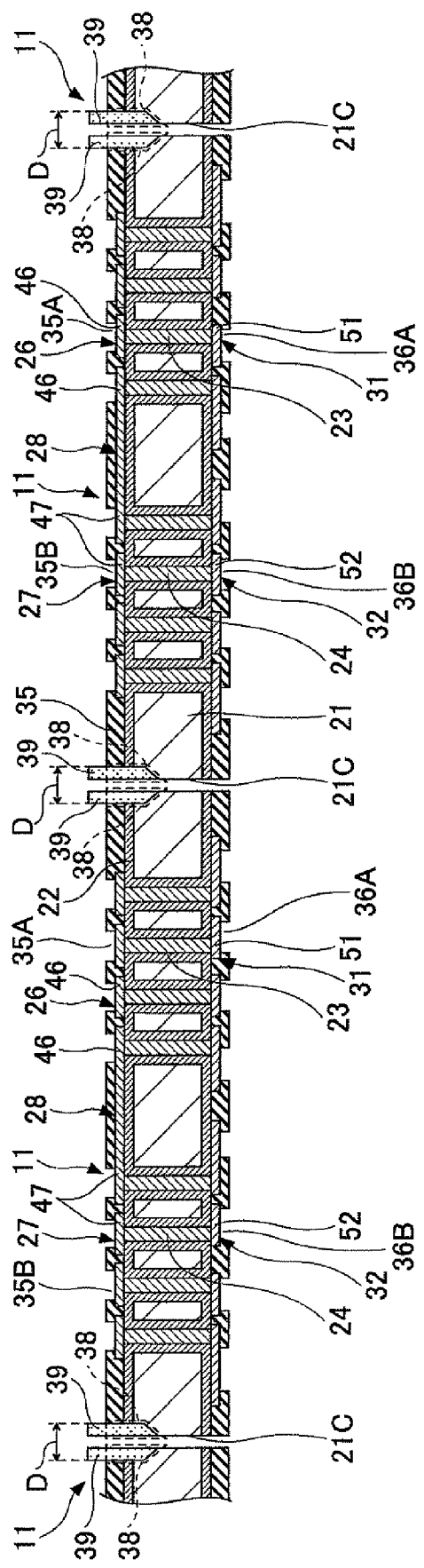
FIG. 12 is a ninth view showing the manufacturing process of the wiring board of the first embodiment of the present invention.
Figure 13:
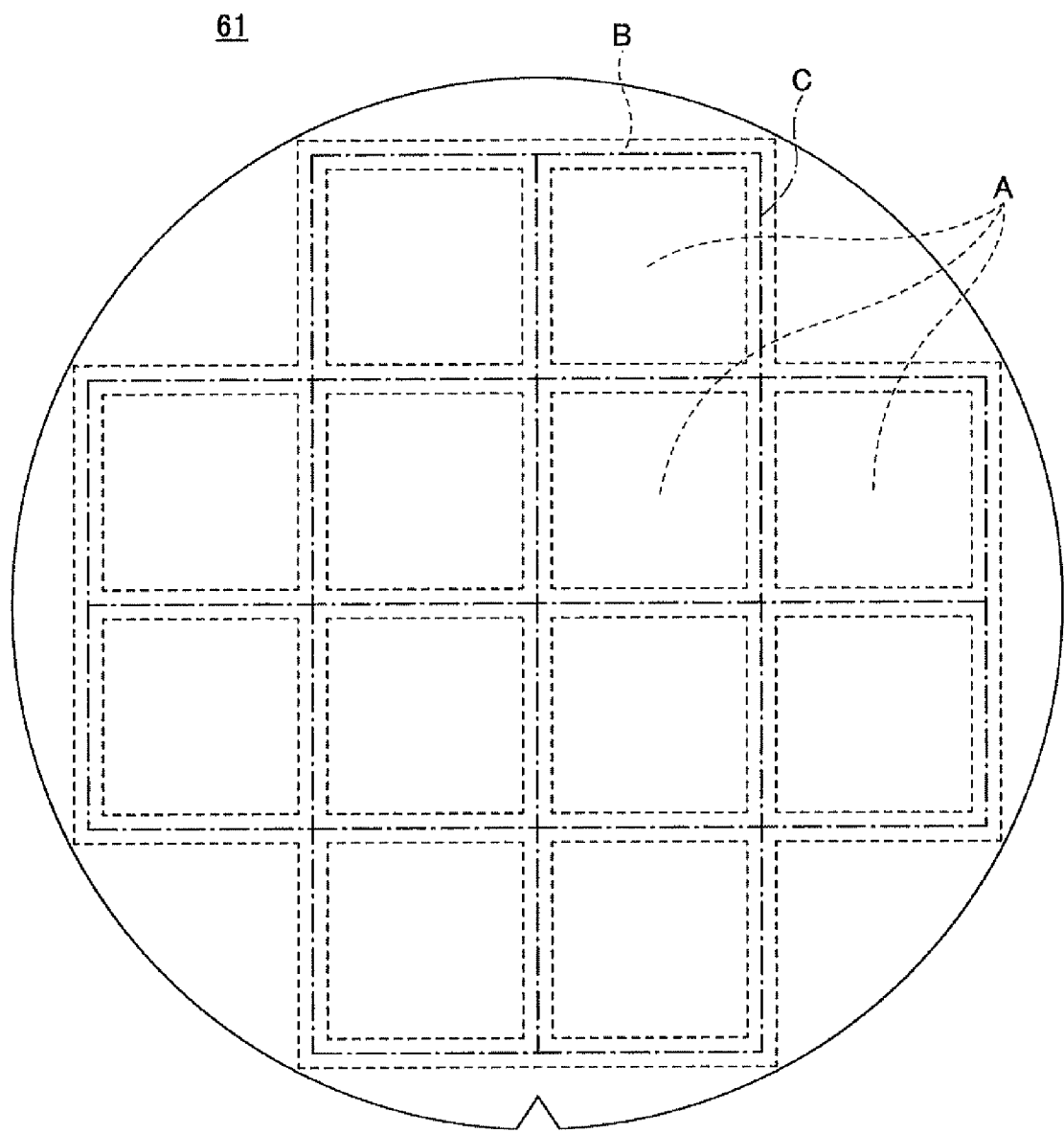
FIG. 13 is a plan view of a structure shown in FIG. 4.

Next, in a step shown in FIG. 12, the dicing tape 64 shown in FIG. 11 is removed and thereby plural wiring boards 11 are completely separated from each other.

Thus, according to the manufacturing method of the wiring board 11 of this embodiment, after the insulation resin layer forming step, the groove part 66 having the width greater than that of the cutting area B is formed in the first insulation resin layer 35, the insulation film 22, the substrate main body 61 of a portion corresponding to the cutting area B and portions of the plural wiring forming areas A neighboring the cutting areas B. Then, the resin 39 is formed in the groove part 66. Next, the substrate main body 61, the second insulation resin layer 36, and the resin 39 filling in the groove part 66 are cut so that pieces of plural wiring boards 11 formed in plural wiring forming areas A can be made. As a result of this, the recess part 38 configured to notch the first corner part of the substrate main body 21 is formed at the corner part of the wiring board 11 positioned at the side where the first insulation resin layer 35 is formed so as to surround the first wiring patterns 26 and 27. The resin 39 is configured to cover the recess part 38. With this structure, it is possible to prevent the corner part of the substrate main body 21 positioned at the upper surface 21A side of the substrate main body 21 from being damaged due to handling of the wiring board 11 (for example, handling between completion of manufacturing of the wiring board 11 and mounting of the electronic components 12 and 13 on the wiring board 11).

Figure 14:
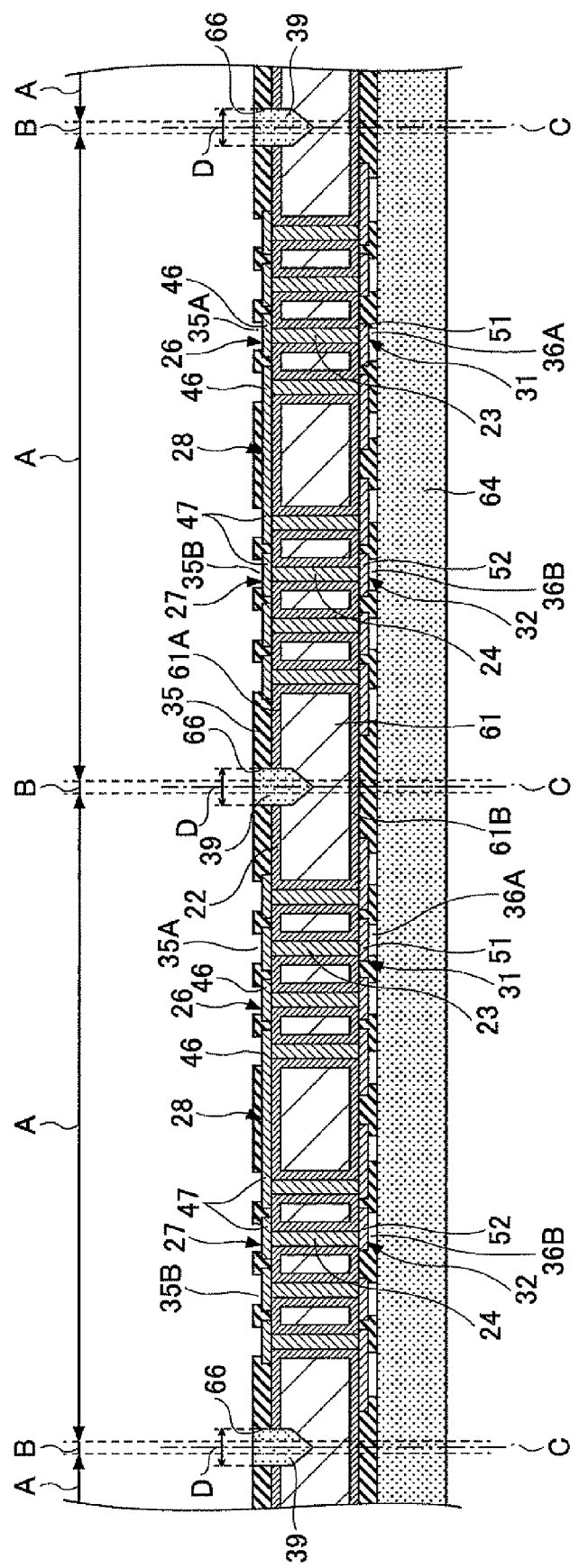
FIG. 14 is a view showing a manufacturing process of a wiring board of a modified example of the first embodiment of the present invention.

FIG. 14 is a view showing a manufacturing process of a wiring board of a modified example of the first embodiment of the present invention. In addition, in FIG. 14, parts that are the same as the parts of the structure shown in FIG. 9 are given the same reference numerals, and explanation thereof is omitted.

In this embodiment, a case where the resin 39 is supplied in the groove part 66 by the printing method using the mask 67 having the piercing hole 67A (see FIG. 9) is discussed as an example. However, the present invention is not limited to this. Instead of the printing method using the mask 67, as shown in FIG. 14, the resin 39 may be supplied in the groove part 66 by an ink jetting method or dispensing method. In this case, it is not necessary to use the mask 67 and it is possible to make the upper surface of the resin 39 provided at the wiring board 11 and the upper surface of the first insulation resin layer 35 have the substantially same surface.

Figure 15:
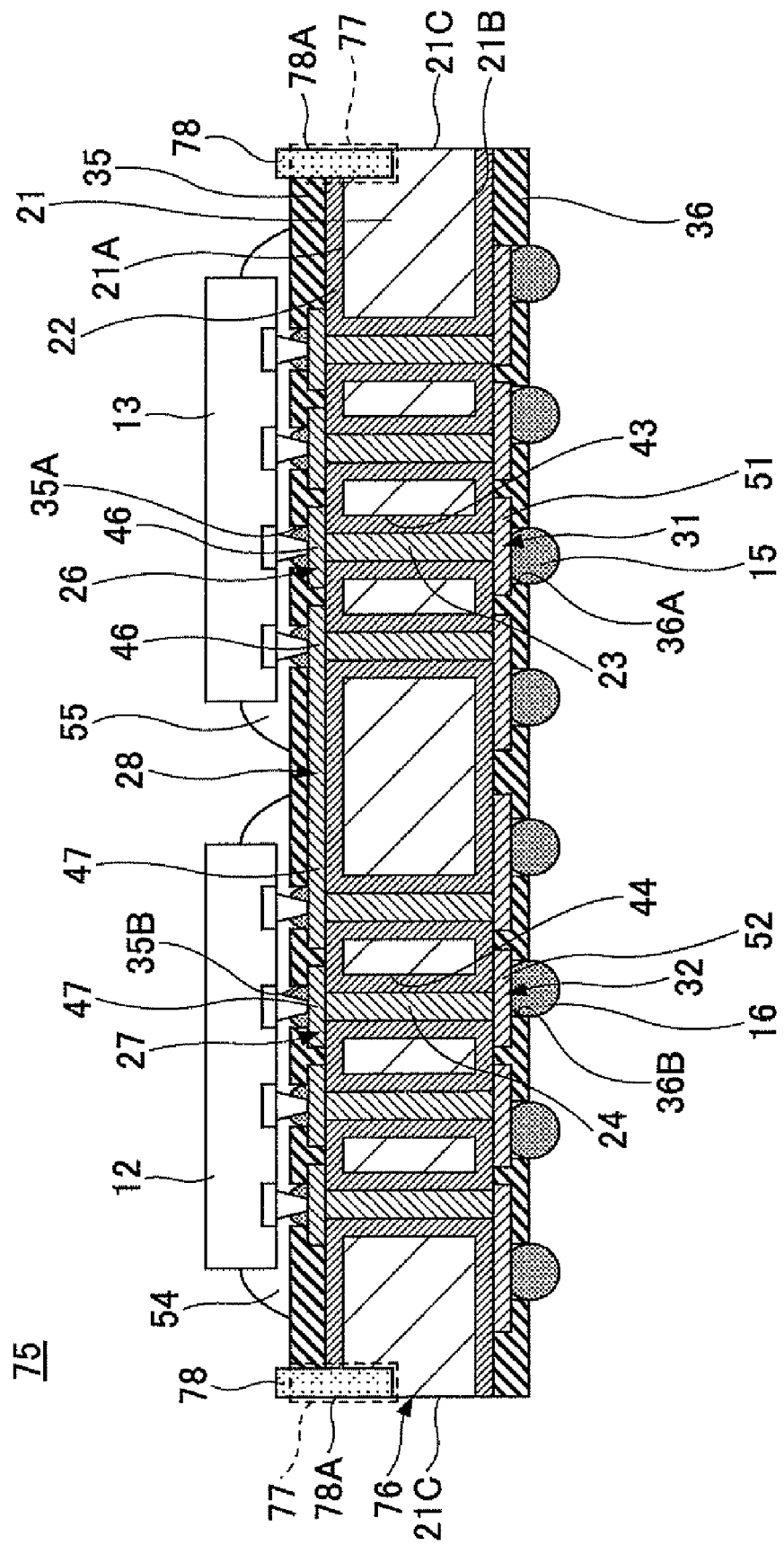
FIG. 15 is a cross-sectional view of a semiconductor device of a first modified example of the first embodiment of the present invention.

FIG. 15 is a cross-sectional view of a semiconductor device of a first modified example of the first embodiment of the present invention. In addition, in FIG. 15, parts that are the same as the parts of the semiconductor device 10 of the first embodiment are given the same reference numerals, and explanation thereof is omitted.

Referring to FIG. 15, a semiconductor device 75 of a first modified example of the first embodiment has the same structure as the semiconductor device 10 except that a wiring board 76 is provided instead of the wiring board 11 provided in the semiconductor device 10 of the first embodiment of the present invention.

The wiring board 76 has the same structure as the wiring board 11 except that a recess part 77 and resin 78 are provided instead of the recess part 38 and the resin 39 provided at the wiring board 11.

The recess part 77 has the same structure as the recess part 38 except that a lower end part of the recess part 77 has a rectangular-shaped cross-sectional configuration. The recess part 77 can be formed by cutting a part of the first insulation resin layer 35, the insulation film 22, and the substrate main body 21 with a dicing blade whose widths of cuts are substantially equal and whose head end has a plane configuration.

The resin 78 is provided in the recess part 77. The resin 78 has the same structure as the resin 39 except that the lower end part of the resin 78 has a rectangular cross-sectional shaped configuration. A side surface 78A of the resin 78 has substantially the same surface as the external circumferential side surface 21C of the substrate main body 21. An upper end of the resin 78 projects upward from the upper surface of the first insulation resin layer 35.

The wiring board 76 of the first modified example of the first embodiment can achieve the substantially same effect as the wiring board 11 of the first embodiment. Although a case where the upper end of the resin 78 projects from the upper surface of the first insulation resin layer 35 is discussed as an example with reference to FIG. 15, an upper end surface of the resin 78 and an upper surface of the first insulation resin layer 35 may be the substantially same surface.

The wiring board 76 of a first modified example of the first embodiment can be formed by a method the same as the manufacturing method of the wiring board 11 of the first embodiment except that the dicing blade whose widths of cuts are substantially equal and whose head end has a plane configuration is used. The manufacturing method of the wiring board 76 can achieve the same effect as that manufacturing method of the wiring board 11 of the first embodiment.

Figure 16:
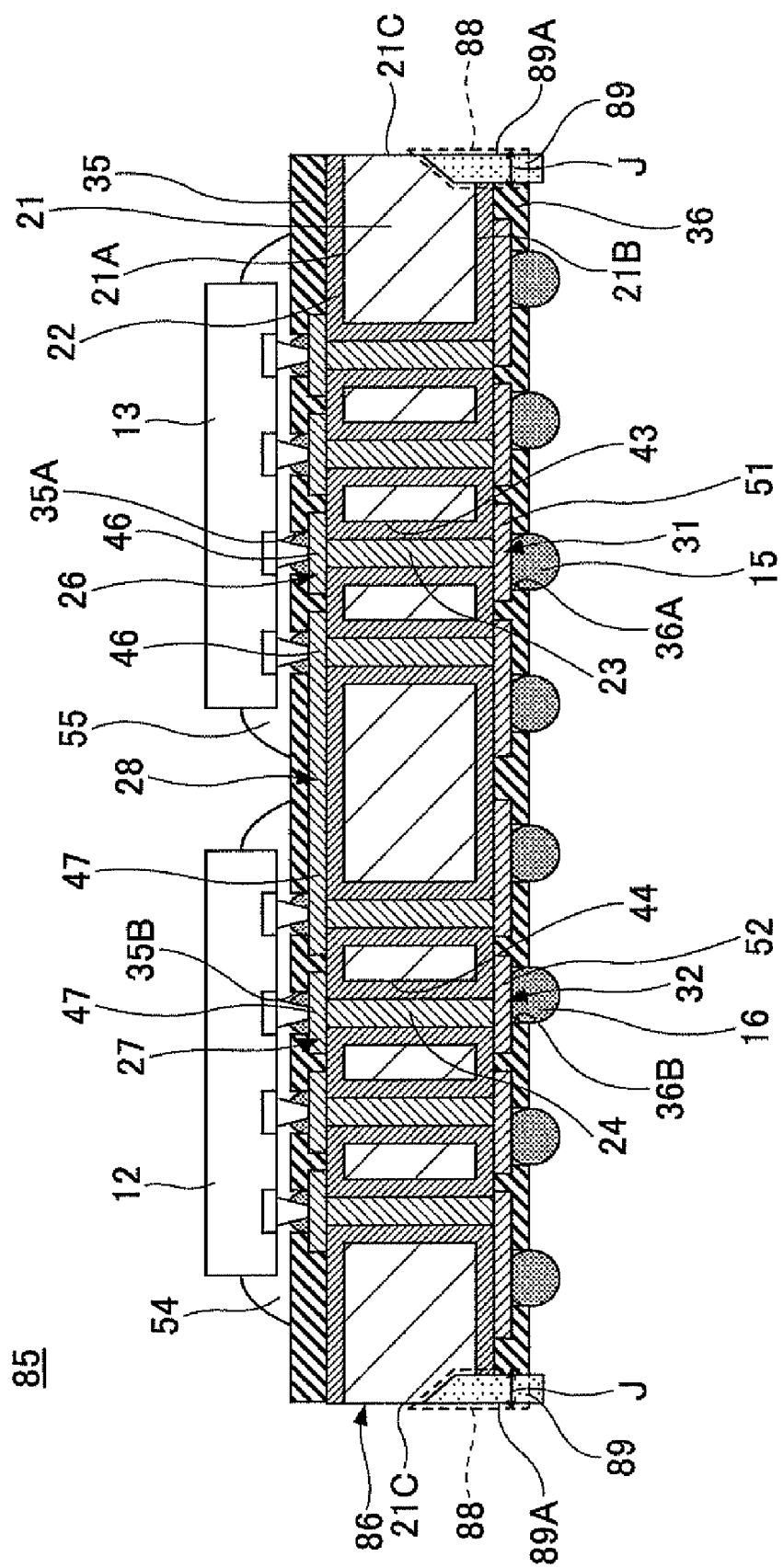
FIG. 16 is a cross-sectional view of a semiconductor device of a second modified example of the first embodiment of the present invention.

FIG. 16 is a cross-sectional view of a semiconductor device of a second modified example of the first embodiment of the present invention. In addition, in FIG. 16, parts that are the same as the parts of the semiconductor device 10 of the first embodiment are given the same reference numerals, and explanation thereof is omitted.

Referring to FIG. 16, a semiconductor device 85 of a second modified example of the first embodiment has the same structure as the semiconductor device 10 except that a wiring board 86 is provided instead of the wiring board 11 provided in the semiconductor device 10 of the first embodiment of the present invention.

The wiring board 86 has the same structure as the wiring board 11 except that a recess part 88 and resin 89 are provided instead of the recess part 38 and the resin 39 provided at the wiring board 11.

The recess part 88 has a configuration where the recess part 38 provided at the wiring board 11 is inverted upside down. The recess part 88 is provided at the corner part of the wiring board 86 at a side where the second insulation resin layer 36 is formed. The recess part 88 is provided so as to surround the second wiring patterns 31 and 32.

The resin 89 has a configuration where the resin 39 provided at the wiring board 11 is inverted to be upside down. The resin 89 is configured to cover the recess part 88. A side surface 89A of the resin 89 has substantially the same surface as the external circumferential side surface 21C of the substrate main body 21. A lower end of the resin 89 projects downward from the lower surface of the second insulation resin layer 36. As the resin 89, for example, epoxy resin, polyimide resin, silicone resin, or the like can be used.

The wiring board 86 of the second modified example of the first embodiment can achieve the substantially same effect as the wiring board 11 of the first embodiment. Although a case where the lower end of the resin 89 projects from the lower surface of the second insulation resin layer 36 is discussed as an example with reference to FIG. 16, a lower end surface of the resin 89 and a lower surface of the second insulation resin layer 36 may be the substantially same surface.

The wiring board 86 of a second modified example of the first embodiment can be formed by a method the same as the manufacturing method of the wiring board 11 of the first embodiment. The manufacturing method of the wiring board 86 can achieve the same effect as that manufacturing method of the wiring board 11 of the first embodiment.

Second Embodiment

Figure 17:
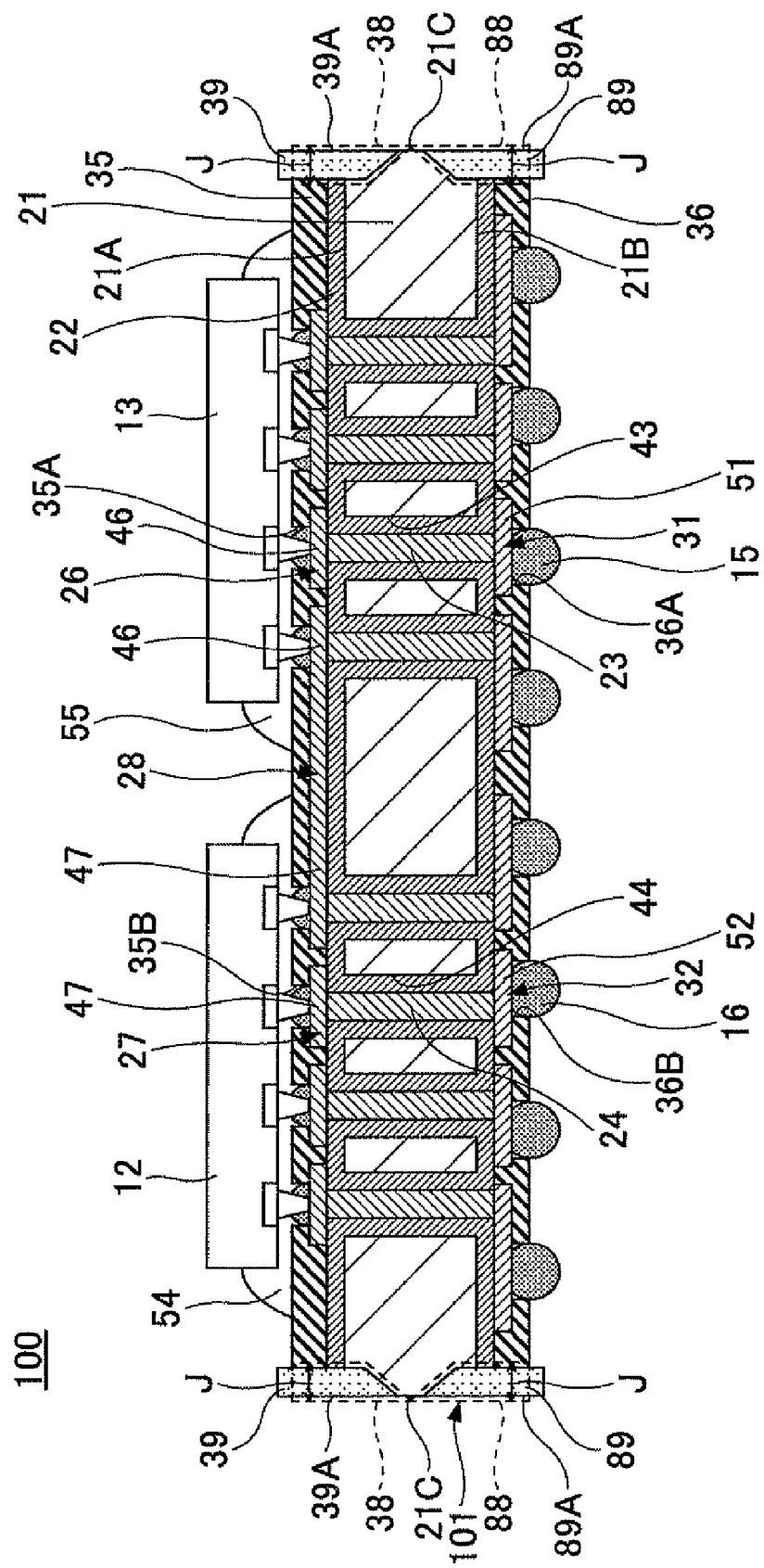
FIG. 17 is a cross-sectional view of a semiconductor device of a second embodiment of the present invention.
Figure 18:
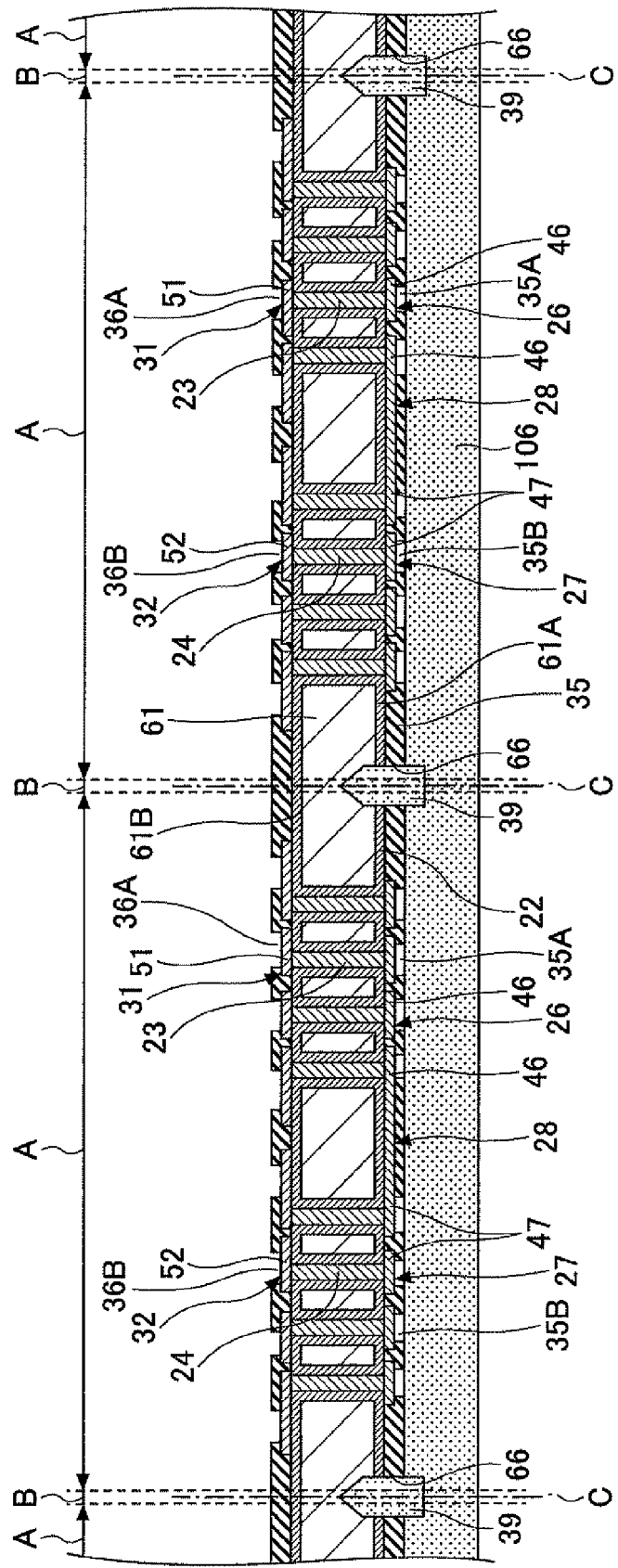
FIG. 18 is a first view showing a manufacturing process of a wiring board of the second embodiment of the present invention.

FIG. 17 is a cross-sectional view of a semiconductor device of a second embodiment of the present invention. In FIG. 17, parts that are the same as the parts of the semiconductor device 10 of the first embodiment are given the same reference numerals, and explanation thereof is omitted.

Referring to FIG. 17, a semiconductor device 100 of the second embodiment has the same structure as the semiconductor device 10 except that a wiring board 101 is provided instead of the wiring board 11 provided in the semiconductor device 10 of the first embodiment of the present invention.

The wiring board 101 has the same structure as the wiring board 11 except that the recess part (second recess part in this embodiment) 88 and the resin (second resin in this embodiment) 89 which are discussed with reference to FIG. 16 are provided in the structure of the wiring board 11.

In other words, in the wiring board 101, an external circumferential part at an upper surface side of the wiring board 101 (including a corner part of the wiring board 101) is covered with the resin 39 and an external circumferential part at a lower surface side of the wiring board 101 (including a corner part of the wiring board 101) is covered with the resin 89. Because of this, in the wiring board 101, the corner parts (first and second corner parts) of the surfaces 21A and 21B of the substrate main body 21 are covered with the resins 39 and 89, respectively, and thereby an area of an external circumferential side surface 21C of the substrate main body 21 which is a part not covered with the resins 39 and 89 can be made small.

According to the wiring board 101 of this embodiment, the recess part 38 configured to notch the first corner part of the substrate main body 21 is formed at the corner part of the wiring board 101 positioned at the upper surface side 21A of the substrate main body 21 so as to surround the first wiring patterns 26 and 27. The resin 39 is configured to cover the recess part 38. The recess part 88 configured to notch the second corner part of the substrate main body 21 is formed at the corner part of the wiring board 101 positioned at the lower surface side 21B of the substrate main body 21 so as to surround the second wiring patterns 31 and 32. The resin 89 is configured to cover the recess part 88. The corner parts (first and second corner parts) of the substrate main body 21 which may be easily damaged are covered with the resins 39 and 89. In addition, an area of an external circumferential side surface 21C of the substrate main body 21 which is a part not covered with the resins 39 and 89 can be made small. With this structure, it is possible to prevent the corner parts (first and second corner parts) of the substrate main body 21 and a part of a side wall of the substrate main body 21 covered with the resins 39 and 89 from being damaged due to handling of the wiring board 101 (for example, handling between completion of manufacturing of the wiring board 101 and mounting of the electronic components 12 and 13 on the wiring board 101).

Although a case where the upper end of the resin 39 projects from the upper surface of the first insulation resin layer 35 and the lower end of the resin 89 projects from the lower surface of the second insulation resin layer 36 is discussed as an example with reference to FIG. 17, an upper end surface of the resin 39 and an upper surface of the first insulation resin layer 35 may be the substantially same surface and a lower end surface of the resin 89 and a lower surface of the second insulation resin layer 36 may be the substantially same surface.

FIG. 18 through FIG. 23 are views showing a manufacturing process of the wiring board of the second embodiment of the present invention. In FIG. 18 through FIG. 23, parts that are the same as the parts of the structures discussed with reference to FIG. 10 through FIG. 12 and of the wiring board 101 discussed above are given the same reference numerals, and explanation thereof is omitted.

First, by performing the same processes as the processes shown in FIG. 4 through FIG. 10, the structure shown in FIG. 10 is formed. Next, in a step shown in FIG. 18, the dicing tape 64 is removed from the structure shown in FIG. 10. Then, the structure where the dicing tape 64 is removed is adhered, inverted to be upside down, to a dicing tape 106.

Figure 19:
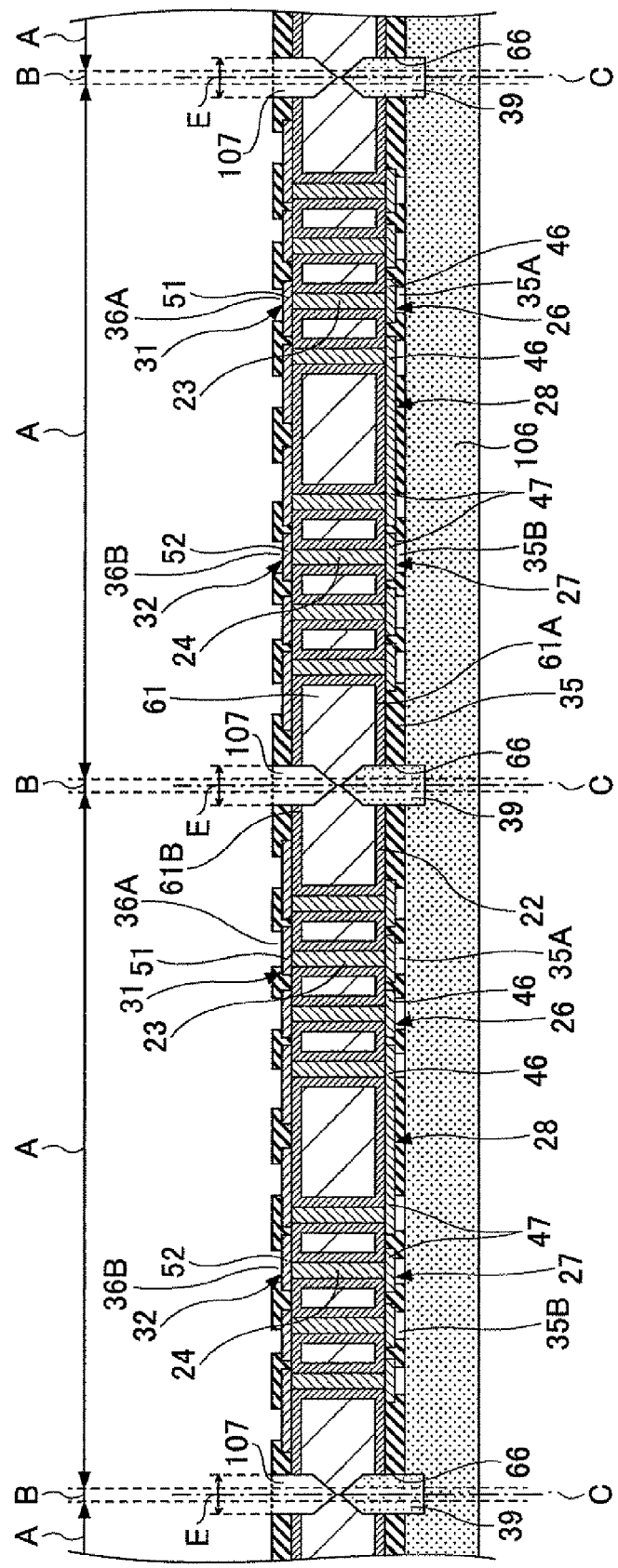
FIG. 19 is a second view showing the manufacturing process of the wiring board of the second embodiment of the present invention.

Next, in a step shown in FIG. 19 (second groove part forming step), a groove part (second groove part) 107 is formed, from a side where the second wiring patterns 31 and 32 are formed, in portions of the second insulation resin layer 36, the insulation film 22, and the substrate main body 61 corresponding to the cutting areas B and portions of the plural wiring forming areas A neighboring the cutting areas B. The width of the second groove part 107 is greater than the width of the cutting area B.

At this time, the groove part 107 may be formed in a bilateral symmetrical manner with respect to a center line C of the cutting area B. The groove part 107 may be connected to the groove part 66 and may be slightly separated from the grove part 66. The groove part 107 can be formed by, for example, a dicer or laser processing. In a case where the groove part 107 is formed by the dicer, for example, a dicing blade whose head end has an acuminate-shaped (wedge-shaped) configuration can be used.

The groove part 107 is cut in a step shown in FIG. 22 so that the recess part 88 (one of the structural elements of the wiring board 101) discussed with reference to FIG. 17 is formed. In a case where the width of the cutting area B is, for example, approximately 40 μm, a width E of the groove part 107 may be, for example, approximately 100 μm. In this case, a depth of the groove part 107 may be, for example, approximately 100 μm.

Figure 20:
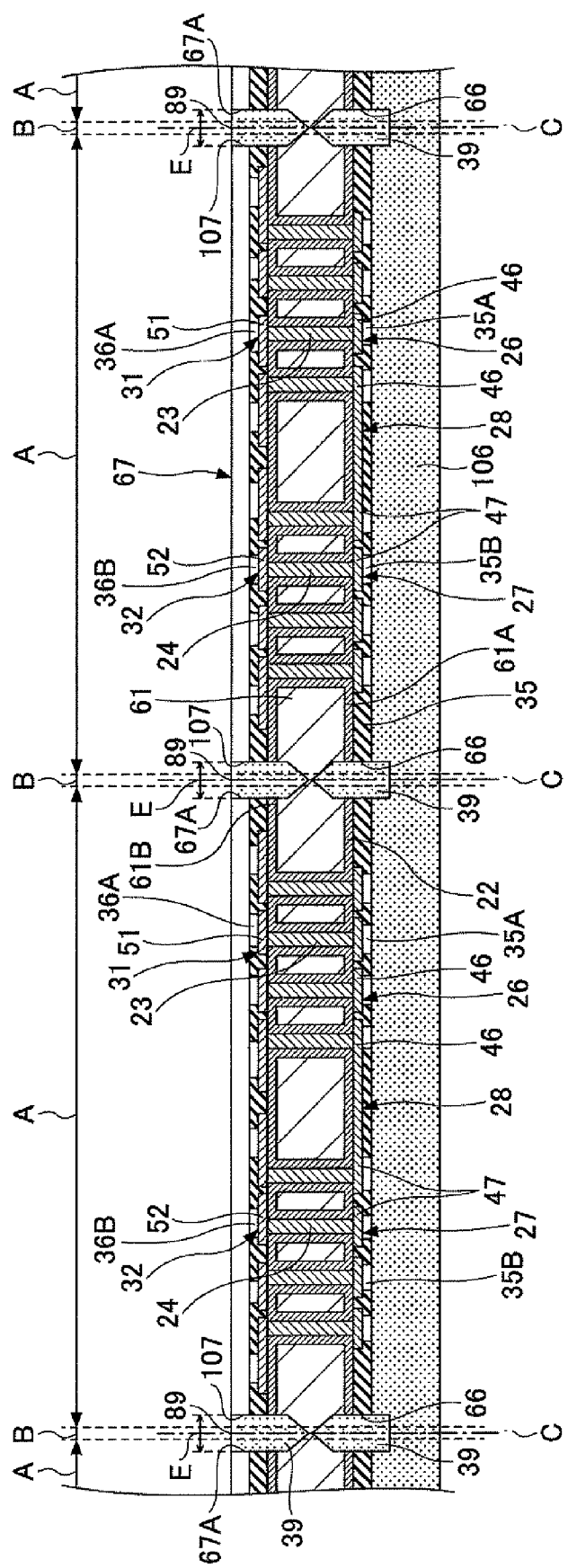
FIG. 20 is a third view showing the manufacturing process of the wiring board of the second embodiment of the present invention.

Next, in a step shown in FIG. 20 (second resin forming step), the stencil mask 67 is mounted on the second insulation resin layer 36. The piercing groove part 67A is formed in a portion of the stencil mask 67 facing the groove part 107. After that, by a printing method, the resin (second resin) 89 is supplied in the groove part 107.

At this time, the resin 89 is formed in the piercing groove part 67A. The resin 89 shown in FIG. 20 is a base material of the resin 89 discussed in reference to FIG. 17. As the resin 89, for example, epoxy resin, polyimide resin, silicone resin, or the like can be used. At this stage, the resin 89 is not completely cured. In other words, the resin 89 is in a semi-cured state. The width of the piercing groove part 67A is substantially equal to the width of the groove part 107. In a case where the width of the groove part 107 is approximately 100 μm, the width of the piercing groove part 67A may be, for example, approximately 100 μm. The thickness of the stencil mask 67 may be, for example, approximately 30 μm.

Figure 21:
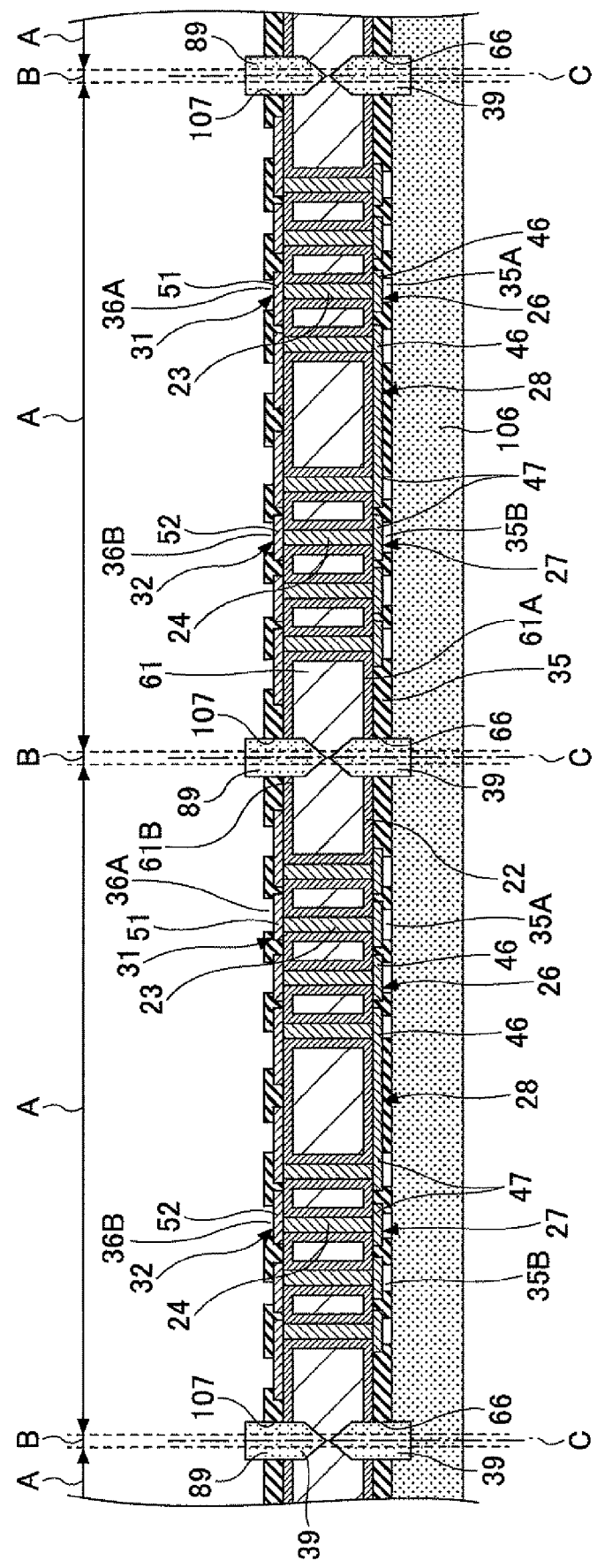
FIG. 21 is a fourth view showing the manufacturing process of the wiring board of the second embodiment of the present invention.

Next, in a step shown in FIG. 21, after the stencil mask 67 shown in FIG. 20 is removed, the resin 89 in the semi-cured state shown in FIG. 20 is completely cured. In a case where the resin 89 is thermosetting epoxy resin, the resin 89 is completely cured by, for example heating the resin 89 in the semi-cured state at approximately 160° C. The completely cured resin 89 is cut in the step shown in FIG. 22 so that the resin 89 shown in FIG. 17 (one of the structural elements of the wiring board 101) is formed.

Figure 22:
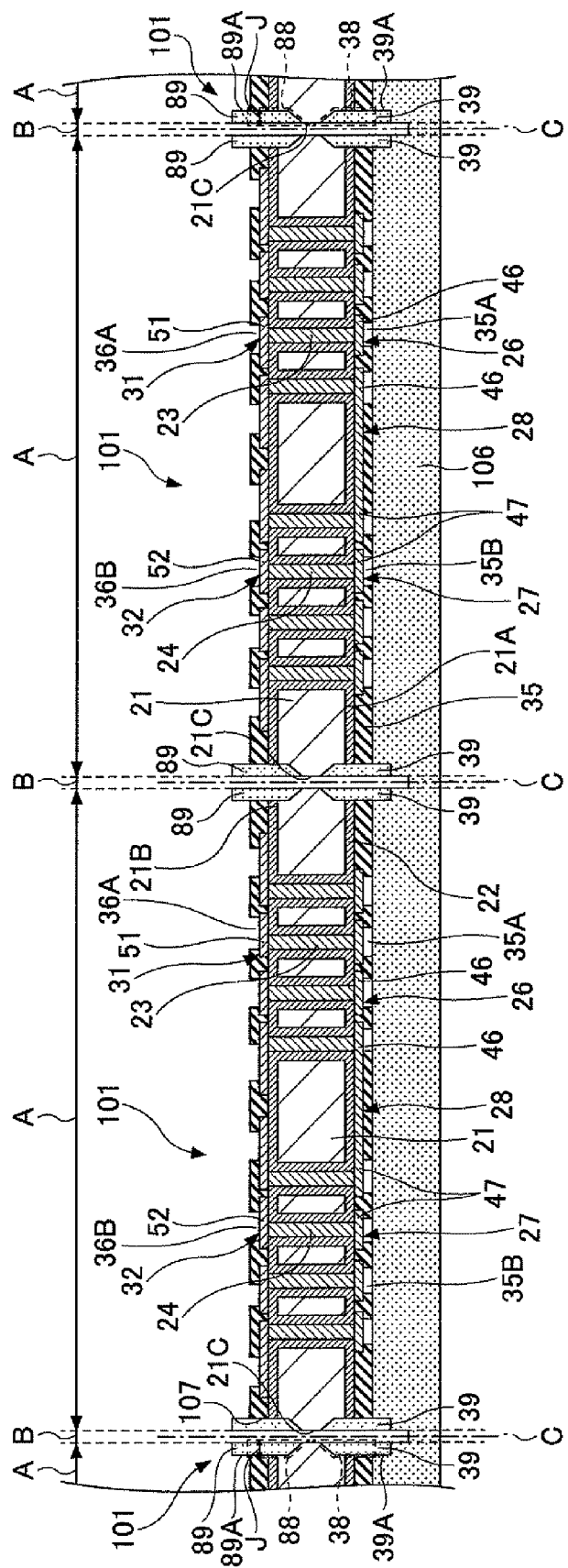
FIG. 22 is a fifth view showing the manufacturing process of the wiring board of the second embodiment of the present invention.

Next, in a step shown in FIG. 22 (cutting step), in the structure shown in FIG. 21, the substrate main body 61 and the resins 39 and 89 of a portion corresponding to the cutting area B are cut so that pieces of plural wiring boards 101 formed in plural wiring forming areas A can be made.

As a result of this, the recess part 38 configured to notch the corner part of the substrate main body 21 is formed at the corner part of the wiring board 101 positioned at the side where the first insulation resin layer 35 is formed so as to surround the first wiring patterns 26 and 27. The resin 39 is configured to cover the recess part 38. The recess part 88 configured to notch the corner part of the substrate main body 21 is formed at the corner part of the wiring board 101 positioned at the side where the second first insulation resin layer 36 is formed so as to surround the second wiring patterns 31 and 32. The resin 89 is configured to cover the recess part 88.

At this time, the width D of the groove part 66 and the width B of the groove part 107 are greater than the width of the cutting area B. Accordingly, on the dicing tape 106, the resin 39 remains at the upper surface side of the first insulation resin layer 35 of the separated plural wiring boards 101 and the resin 89 remains at the lower surface side of the second insulation resin layer 36 of the separated plural wiring boards 101.

The substrate main body 61 and the resins 39 and 89 of a portion corresponding to the cutting area B can be cut by, for example, a dicer, laser processing, or the like. At this stage, separated plural wiring boards 101 are adhered to the dicing tape 106.

Figure 23:
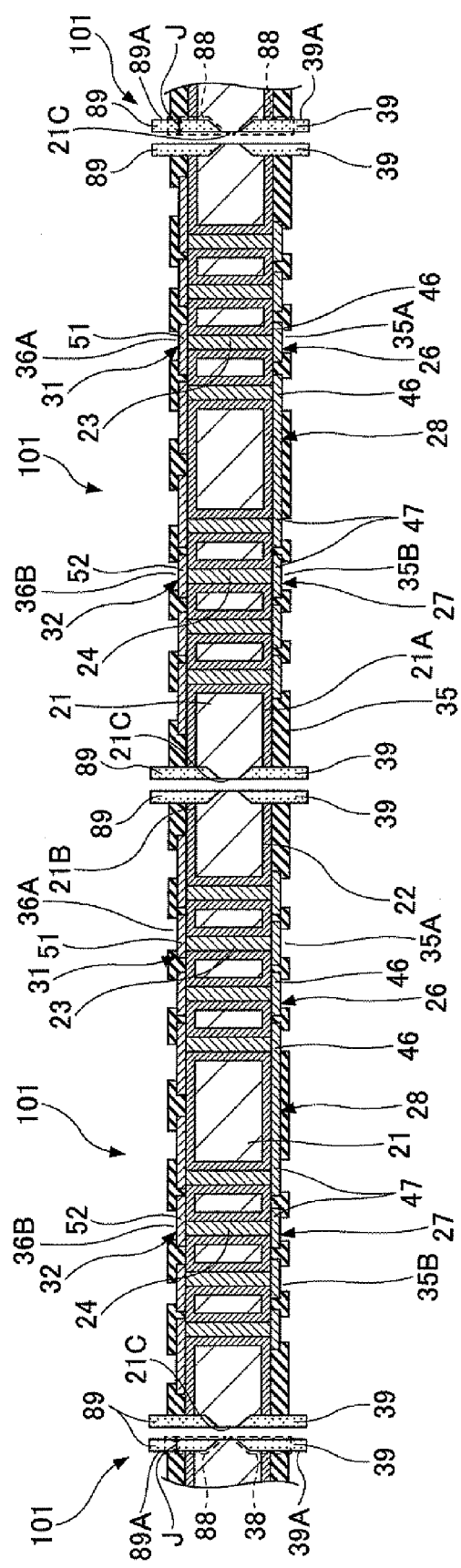
FIG. 23 is a sixth view showing the manufacturing process of the wiring board of the second embodiment of the present invention.

Next, in a step shown in FIG. 23, the dicing tape 106 shown in FIG. 22 is removed and thereby plural wiring boards 101 are completely separated from each other.

Thus, according to the manufacturing method of the wiring board of this embodiment, after the resin 39 is formed in the groove part 66, the groove part (second groove part) 107 is formed, on a side where the second wiring patterns 31 and 32 are formed, in portions of the second insulation resin layer 36, the insulation film 22, and the substrate main body 61 corresponding to the cutting areas B and portions of the plural wiring forming areas A neighboring the cutting areas B. The width of the second groove part 107 is greater than the width of the cutting area B. Then, the resin 89 is formed in the groove part 107. Next, the substrate main body 61 and the resins 39 and 89 at a part corresponding to the cutting area B are cut so that pieces of plural wiring boards 101 formed in the plural wiring forming areas A can be made. As a result of this, the recess part 38 is configured to notch the first corner part of the substrate main body 21 positioned at the side where the first insulation resin layer 35 is formed so as to surround the first wiring patterns 26 and 27. The resin 39 is configured to cover the recess part 38. The recess part 88 is configured to notch the second corner part of the substrate main body 21 positioned at the side where the second insulation resin layer 36 is formed so as to surround the second wiring patterns 31 and 32. The resin 89 is configured to cover the recess part 88. The corner parts (first and second corner parts) of the substrate main body 21 which may be easily damaged are covered with the resins 39 and 89. In addition, an area of an external circumferential side surface 210 of the substrate main body 21 which is a part not covered with the resins 39 and 89 can be made small.

With this structure, it is possible to prevent the corner parts (first and second corner parts) of the substrate main body 21 and a part of a side wall of the substrate main body 21 covered with the resins 39 and 89 from being damaged due to handling of the wiring board 101 (for example, handling between completion of manufacturing of the wiring board 101 and mounting of the electronic components 12 and 13 on the wiring board 101).

Figure 24:
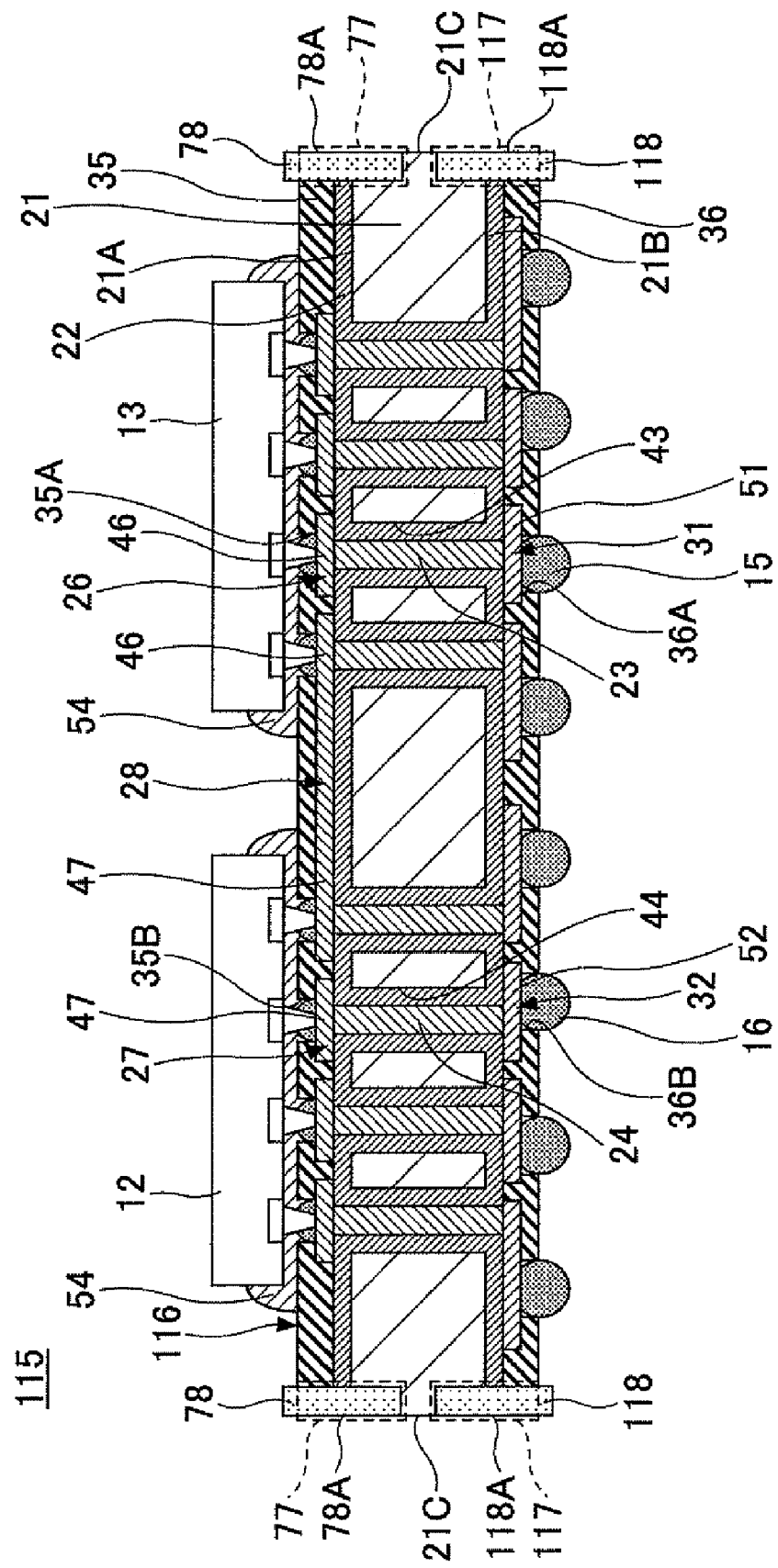
FIG. 24 is a cross-sectional view of a semiconductor device of a first modified example of the second embodiment of the present invention.

FIG. 24 is a cross-sectional view of a semiconductor device of a first modified example of the second embodiment of the present invention. In addition, in FIG. 24, parts that are the same as the parts of the semiconductor device 75 of the first modified example of the first embodiment are given the same reference numerals, and explanation thereof is omitted.

Referring to FIG. 24, a semiconductor device 115 of a first modified example of the second embodiment has the same structure as the semiconductor device 75 except that a wiring board 116 is provided instead of the wiring board 76 provided in the semiconductor device 75 of the first modified example of the first embodiment of the present invention.

The wiring board 116 has the same structure as the wiring board 76 except that a recess part (second recess part) 117 and resin (second resin) 118 are provided at the structure of the wiring board 116. The recess part 117 is provided at a corner part of the wiring board 116 positioned at the lower surface 21B side of the substrate main body 21. The recess part 117 has the same configuration as that of the recess part 77 so as to surround the second wiring patterns 31 and 32.

The resin 118 is provided at the recess part 117. The resin 118 has the same structure (same configuration and made of the same material) as the resin 78. A lower end of the resin 118 projects from the lower surface of the second insulation resin layer 36. A side surface 118A of the resin 118 has substantially the same surface as the external circumferential side surface 21C of the substrate main body 21.

The wiring board 116 of the first modified example of the second embodiment can achieve the substantially same effect as the wiring board 101 of the second embodiment. In other words, the configurations of the recess parts formed at the corner parts of the surfaces 21A and 21B of the substrate main body 21 and the resin are not limited to the configurations of the recess parts 38, 88, 77 and 117 and the resin 39, 89, 78 and 118.

In the example shown in FIG. 24, the upper end of the resin 78 projects from the upper surface of the first insulation resin layer 35, and the lower end of the resin 118 projects from the lower surface of the second insulation resin layer 36. However, the upper end surface of the resin 78 and the upper surface of the first insulation resin layer 35 may be substantially the same surface and the lower end surface of the resin 118 and the lower surface of the second insulation resin layer 36 may be substantially the same surface.

The wiring board 116 can be manufactured by the same method as that of the wiring board 101 of the second embodiment except that a dicing blade having substantially equal widths of cuts and a head end having a plane configuration is used for forming the groove (not shown) being cut so that the recess parts 77 and 117 are made.

Figure 25:
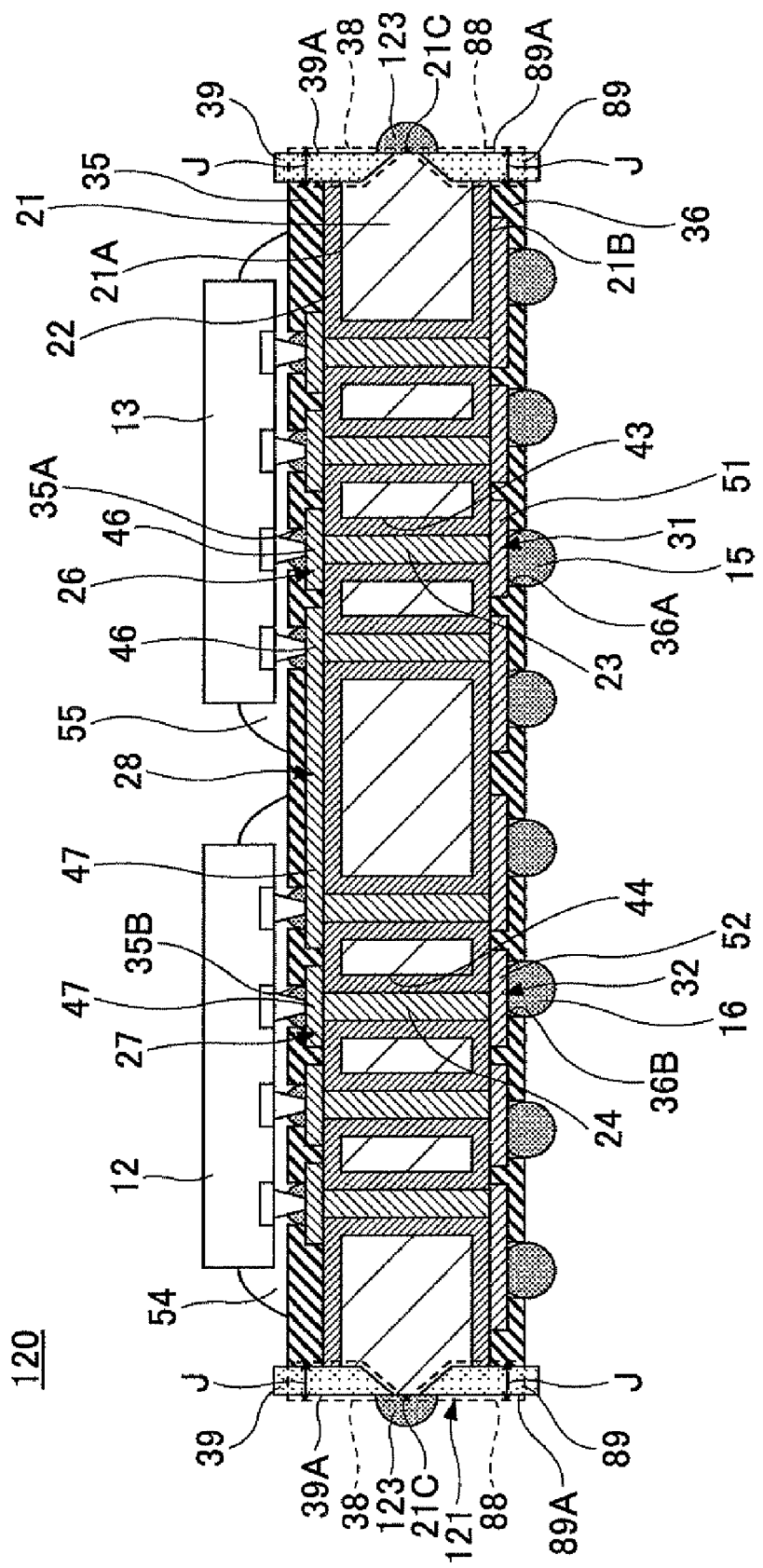
FIG. 25 is a cross-sectional view of a semiconductor device of a second modified example of the second embodiment of the present invention.

FIG. 25 is a cross-sectional view of a semiconductor device of a second modified example of the second embodiment of the present invention. In addition, in FIG. 25, parts that are the same as the parts of the semiconductor device 100 of the second embodiment are given the same reference numerals, and explanation thereof is omitted.

Referring to FIG. 25, a semiconductor device 120 of a second modified example of the second embodiment has the same structure as the semiconductor device 100 except that a wiring board 121 is provided instead of the wiring board 101 provided in the semiconductor device 100 of the second embodiment of the present invention.

The wiring board 121 has the same structure as that of the wiring board 101 except that resin (third resin) 123 is provided. The resin 123 is provided so as to cover the external circumferential side surface 21C of the substrate main body 21 positioned between the resin 39 and the resin 89. As the resin 123, for example, epoxy resin, polyimide resin, silicone resin, or the like can be used. The resin 123 can be formed by, for example, a dispensing method.

Thus, the recess parts 38 and 88, the resin 39 configured to cover the recess part 38, the resin 89 configured to cover the recess part 88, and the resin 123 configured to cover the external circumferential side surface 21C of the substrate main body 21 positioned between the resin 39 and the resin 89 are provided in this example. Hence, it is possible to protect the corner parts (first and second corner parts) formed at the both surfaces 21A and 21B of the substrate main body 21 and the external circumferential side surface 21C of the substrate main body 21 by the resins 39, 89, and 123.

With this structure, it is possible to prevent the corner parts (first and second corner parts) formed on the both surfaces 21A and 21B of the substrate main body 21 and the external circumferential side surface 21C of the substrate main body 21 from being damaged due to handling of the wiring board 121 (for example, handling between completion of manufacturing of the wiring board 121 and mounting of the electronic components 12 and 13 on the wiring board 121).

Figure 26:
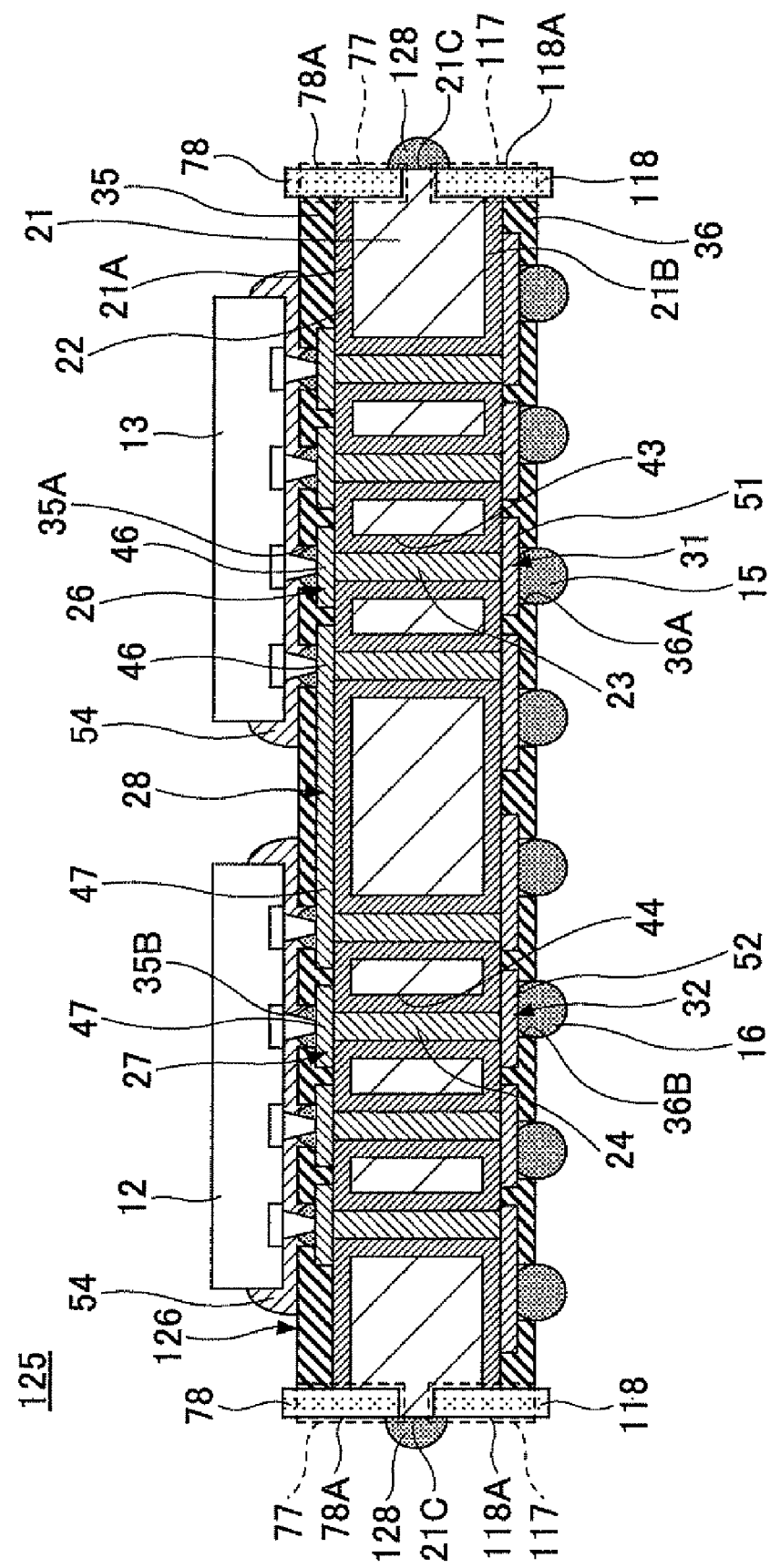
FIG. 26 is a cross-sectional view of a semiconductor device of a third modified example of the second embodiment of the present invention.

FIG. 26 is a cross-sectional view of a semiconductor device of a third modified example of the second embodiment of the present invention. In addition, in FIG. 26, parts that are the same as the parts of the semiconductor device 115 of the first modified example of the second embodiment are given the same reference numerals, and explanation thereof is omitted.

Referring to FIG. 26, a semiconductor device 125 of a third modified example of the second embodiment has the same structure as the semiconductor device 115 except that a wiring board 126 is provided instead of the wiring board 116 provided in the semiconductor device 115 of the first modified example of the second embodiment of the present invention.

The wiring board 126 has the same structure as that of the wiring board 116 except that resin 128 is provided. The resin 128 is provided so as to cover the external circumferential side surface 21C of the substrate main body 21 of a part positioned between the resin 78 and the resin 118. As the resin 128, for example, epoxy resin, polyimide resin, silicone resin, or the like can be used. The resin 128 can be formed by, for example, a dispensing method.

The wiring board 126 of the third modified example of the second embodiment can achieve the same effect as the wiring board 121 of the second modified example of the second embodiment.

Third Embodiment

Figure 27:
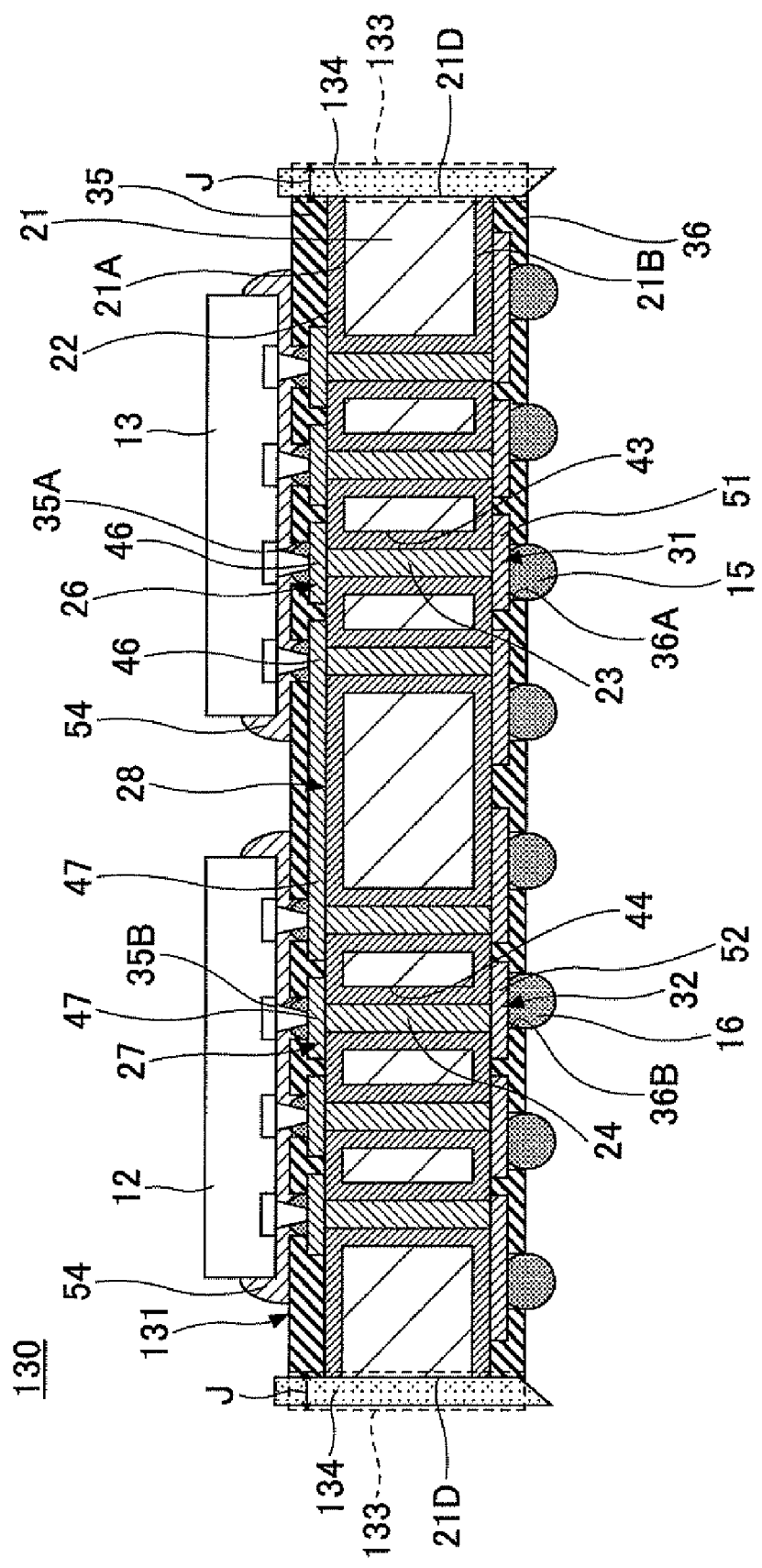
FIG. 27 is a cross-sectional view of a semiconductor device of a third embodiment of the present invention.

FIG. 27 is a cross-sectional view of a semiconductor device of a third embodiment of the present invention. In FIG. 27, parts that are the same as the parts of the semiconductor device 10 of the first embodiment are given the same reference numerals, and explanation thereof is omitted.

Referring to FIG. 27, a semiconductor device 130 of the third embodiment has the same structure as the semiconductor device 10 except that a wiring board 131 is provided instead of the wiring board 11 provided in the semiconductor device 10 of the first embodiment of the present invention.

The wiring board 131 has the same structure as the wiring board 11 except that a recess part 133 and resin 134 are provided instead of the recess part 38 and the resin 39 provided at the wiring board 11.

The recess part 133 is continuous and provided at the external circumferential part of the wiring board 131. The recess part 133 is configured to pierce the substrate main body 21, the insulation film 22, the first insulation resin layer 35 and the second insulation resin layer 36 of a portion positioned at the external circumferential part of the wiring board 131. The recess part 133 is configured to surround the first and second wiring patterns 26, 27, 31, and 32 and the piercing electrodes 23 and 24.

The resin 134 is provided so as to cover the recess part 133 and the entirety of an external circumferential side surface 21D of the substrate main body 21. As the resin 134, for example, epoxy resin, polyimide resin, silicone resin, or the like can be used.

According to the wiring board 131 of this embodiment, the recess part 133 and the resin 134 are provided at the external circumferential part of the wiring board 131. The recess part 133 is formed so as to surround the first and second wiring patterns 26, 27, 31 and 32 and the piercing electrodes 23 and 24. The recess part 133 is configured to pierce the substrate main body 21 of a part positioned at the external circumferential part of the wiring board 131. The resin 134 is configured to cover the recess part 133. As a result of this, it is possible to protect the external circumferential part (including the corner parts formed at the both surfaces 21A and 21B of the substrate main body 21) of the substrate main body 21 by the resin 134. With this structure, it is possible to prevent the external circumferential part (including the corner parts formed at the both surfaces 21A and 21B of the substrate main body 21) of the substrate main body 21 from being damaged due to handling of the wiring board 131 (for example, handling between completion of manufacturing of the wiring board 131 and mounting of the electronic components 12 and 13 on the wiring board 131).

FIG. 28 through FIG. 33 are views showing a manufacturing process of the wiring board of the third embodiment of the present invention. In FIG. 28 through FIG. 33, parts that are the same as the parts of the structures discussed with reference to FIG. 6 and of the wiring board 131 of FIG. 27 discussed above are given the same reference numerals, and explanation thereof is omitted.

The manufacturing method of the wiring board 131 of the third embodiment of the present invention is discussed with reference to FIG. 28 through FIG. 33. First, by performing the same processes as those discussed in the first embodiment with reference to FIG. 4 through FIG. 6, the structure shown in FIG. 6 is formed in FIG. 28.

Figure 28:
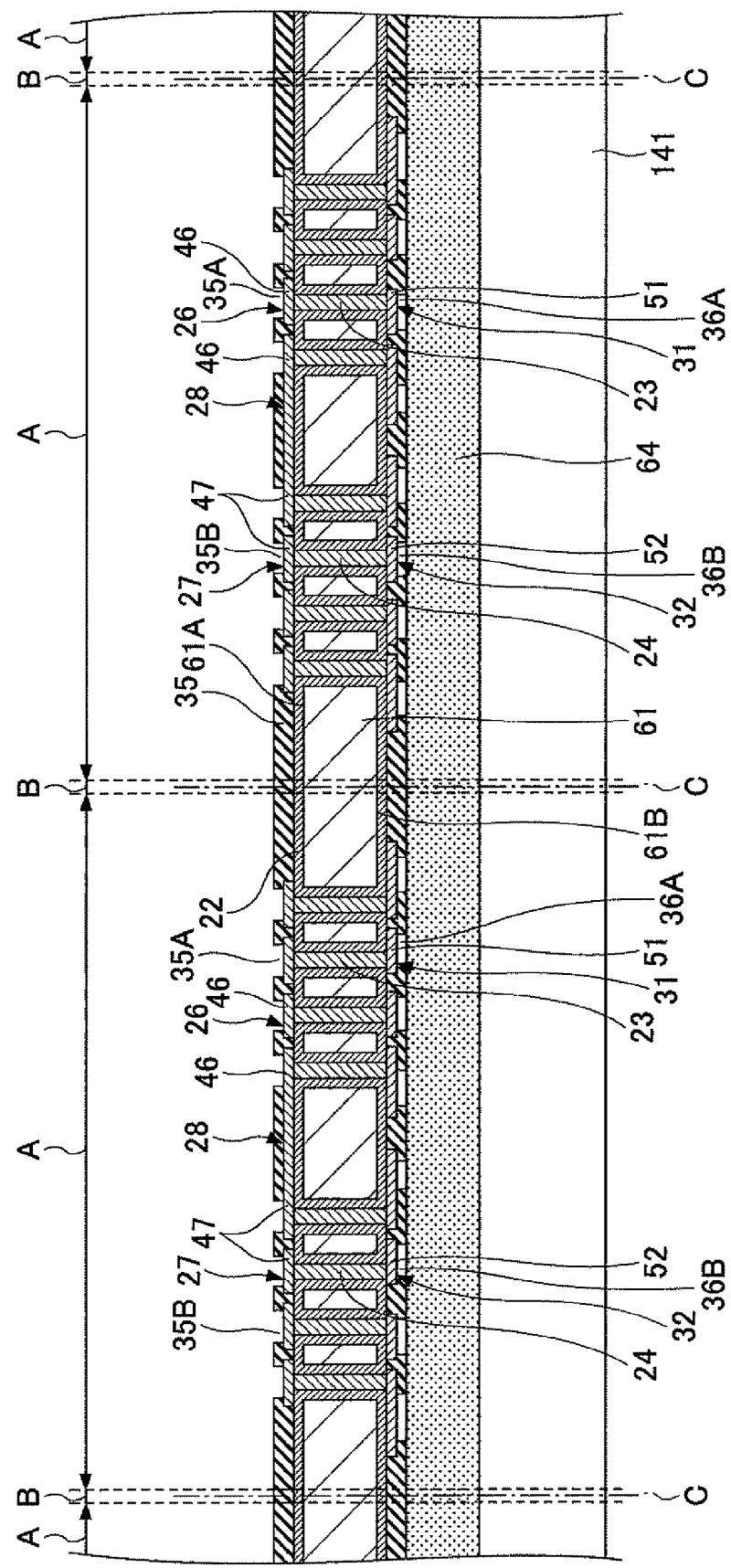
FIG. 28 is a first view showing a manufacturing process of a wiring board of the third embodiment of the present invention.

Next, in a step shown in FIG. 28, a supporting body 141 where the dicing tape 64 is adhered is prepared. The structure shown in FIG. 6 is adhered to the dicing tape 64. The supporting body 141 functions as a reinforcing plate. As the supporting body 141, for example, a glass plate can be used. In this case, the thickness of the supporting body 141 may be, for example, approximately 500 μm.

Figure 29:
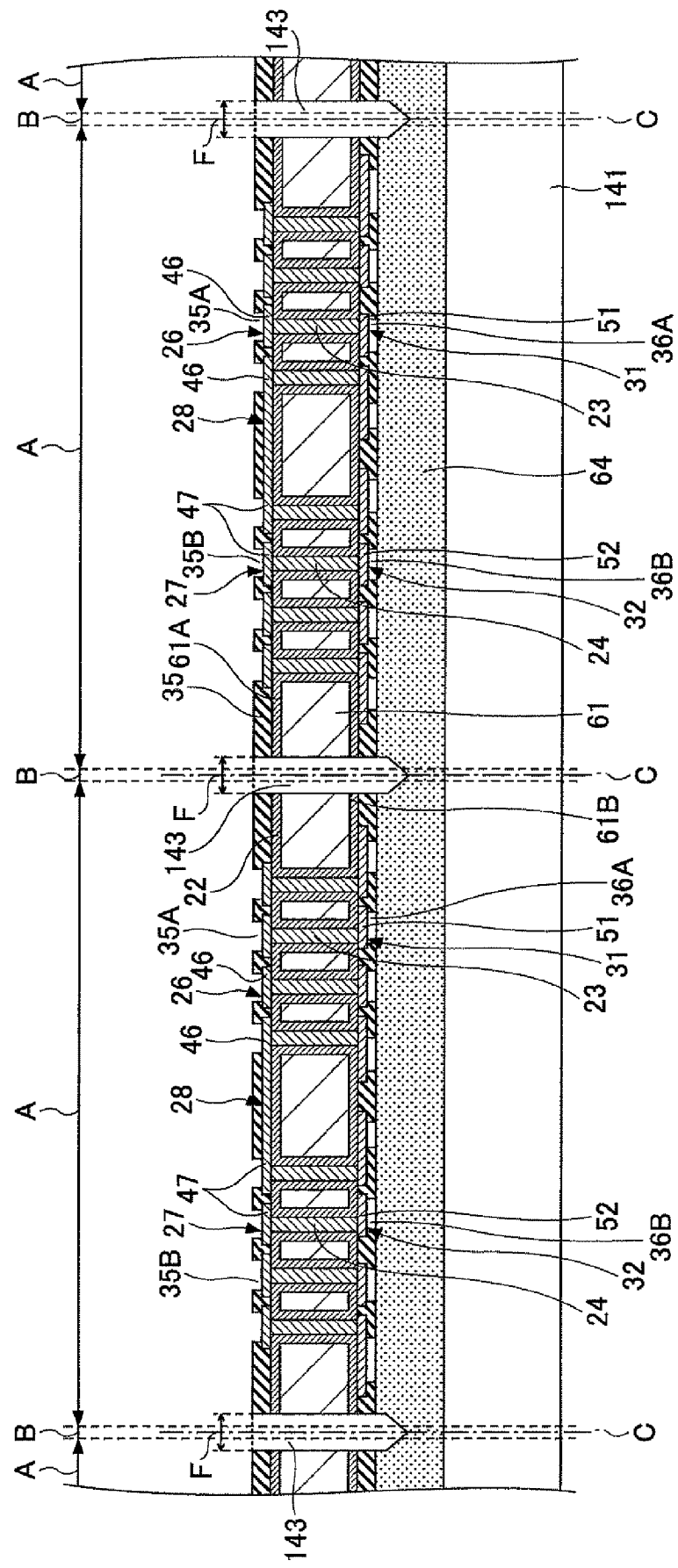
FIG. 29 is a second view showing the manufacturing process of the wiring board of the third embodiment of the present invention.

Next, in a step shown in FIG. 29 (piercing groove part forming step), a groove part 143 is formed so as to pierce the insulation film 22, the first insulation resin layer 35, the second insulation resin layer 36, and the substrate main body 61 of a portion corresponding to the cutting areas B and a portion of the plural wiring forming areas A neighboring the cutting areas B. The width of the groove part 143 is greater than the width of the cutting area B.

At this time, the groove part 143 may be formed in a bilateral symmetrical manner with respect to the center line C of the cutting area B. The groove part 143 can be formed by, for example, a dicer or laser processing. The groove part 143 is cut in a step shown in FIG. 29 so that the recess part 133 (one of the structural elements of the wiring board 131) discussed with reference to FIG. 27 is formed. In a case where the width of the cutting area B is, for example, approximately 40 μm, a width F of the groove part 143 may be, for example, approximately 100 μm.

Figure 30:
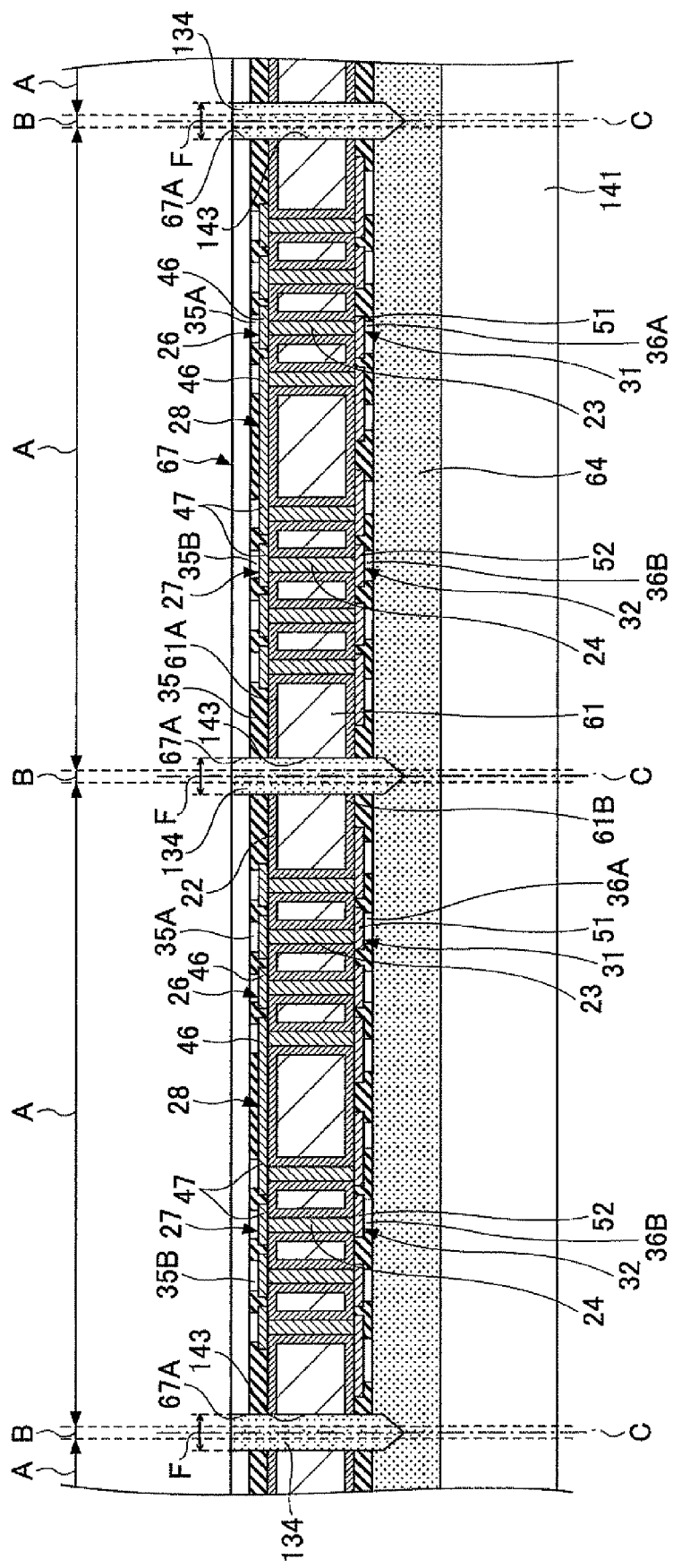
FIG. 30 is a third view showing the manufacturing process of the wiring board of the third embodiment of the present invention.

Next, in a step shown in FIG. 30 (resin forming step), the stencil mask 67 is mounted on the first insulation resin layer 35. The piercing groove part 67A is formed in a portion of the stencil mask 67 facing the groove part 143. After that, by a printing method, the resin 134 filling the groove part 143 is formed.

At this time, the resin 134 is formed in the piercing groove part 67A. The resin 134 shown in FIG. 30 is a base material of the resin 134 discussed in reference to FIG. 27. As the resin 134, for example, epoxy resin, polyimide resin, silicone resin, or the like can be used. At this stage, the resin 134 is not completely cured. In other words, the resin 134 is in a semi-cured state. The width of the piercing groove part 67A is substantially equal to the width F of the groove part 143. In a case where the width F of the groove part 143 is approximately 100 μm, the width of the piercing groove part 67A may be, for example, approximately 100 μm. The thickness of the stencil mask 67 may be, for example, approximately 30 μm.

Figure 31:
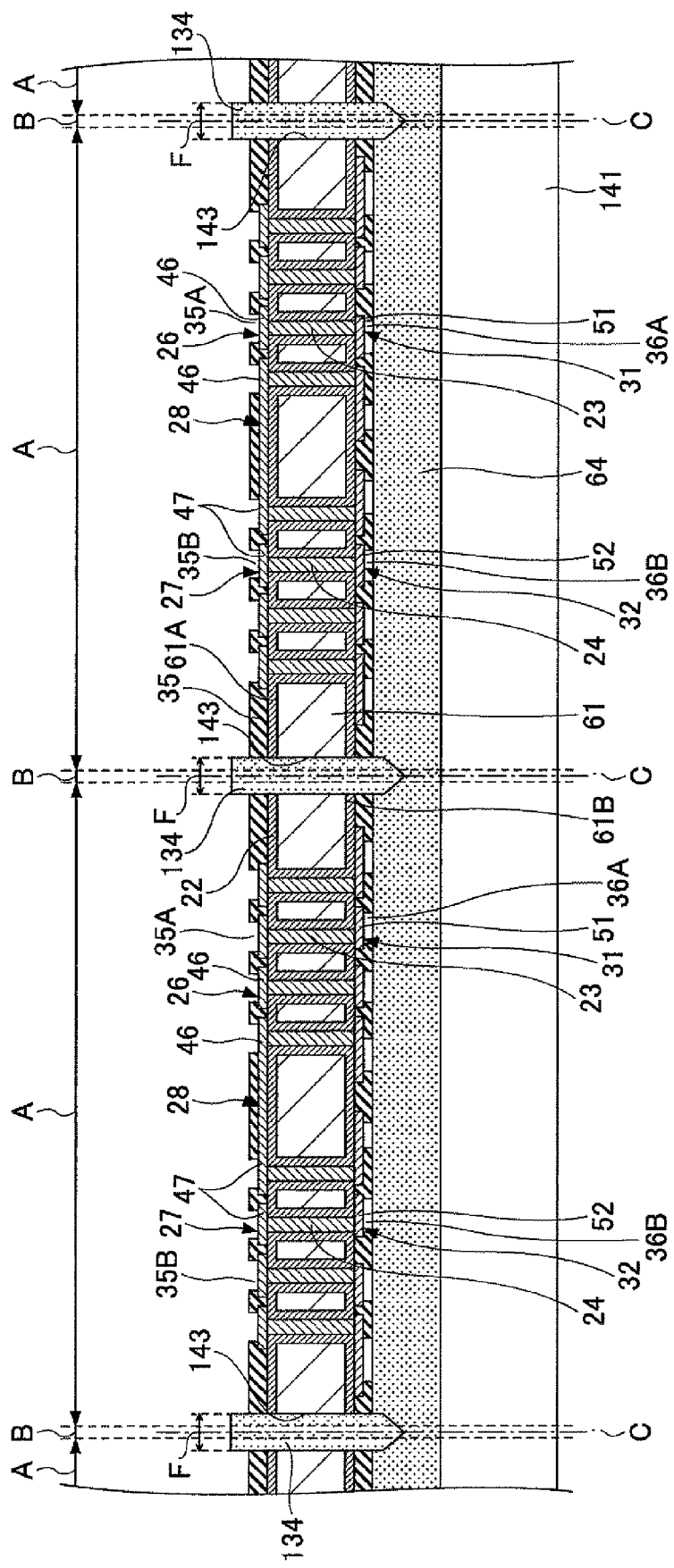
FIG. 31 is a fourth view showing the manufacturing process of the wiring board of the third embodiment of the present invention.

Next, in a step shown in FIG. 31, after the stencil mask 67 shown in FIG. 30 is removed, the resin 134 in the semi-cured state shown in FIG. 30 is completely cured. In a case where the resin 134 is thermosetting epoxy resin, the resin 134 is completely cured by, for example heating the resin 134 in the semi-cured state at approximately 160° C. The completely cured resin 134 is cut in the step shown in FIG. 32 so that the resin 134 shown in FIG. 27 (one of the structural elements of the wiring board 101) is formed.

Figure 32:
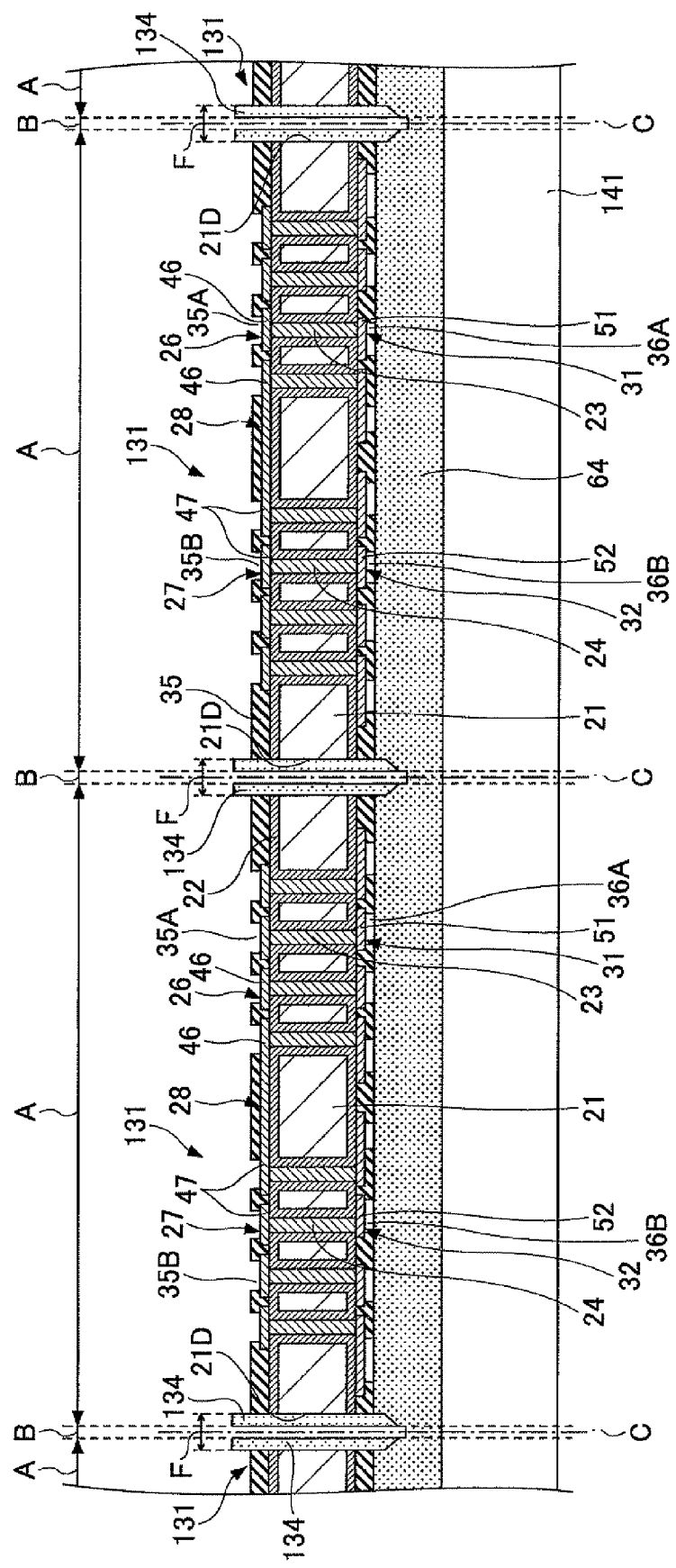
FIG. 32 is a fifth view showing the manufacturing process of the wiring board of the third embodiment of the present invention.

Next, in a step shown in FIG. 32 (cutting step), in the structure shown in FIG. 31, the resin 134 of portions corresponding to the cutting areas B is cut so that pieces of plural wiring boards 131 formed in plural wiring forming areas A can be made.

As a result of this, the recess part 133 configured to surround the first and second wiring patterns 26, 27, 31, and 32 and the piercing electrodes 23 and 24 and the resin 134 configured to cover the recess part 133 are formed at the external circumferential part of the wiring board 131.

At this time, the width F of the groove part 143 is greater than the width of the cutting area B. Accordingly, it is possible for the resin 134 to cover the entirety of the external circumferential side surface 210 of the substrate main body 21 provided at separated plural wiring boards 131 on the dicing tape 64. With this structure, it is possible to prevent the external circumferential part of the substrate main body 21 from being damaged due to handling of the wiring board 131 (for example, handling between completion of manufacturing of the wiring board 131 and mounting of the electronic components 12 and 13 on the wiring board 131).

The resin 134 of a portion corresponding to the cutting area B can be cut by, for example, a dicer, laser processing, or the like. At this stage, separated plural wiring boards 131 are adhered to the dicing tape 64.

Figure 33:
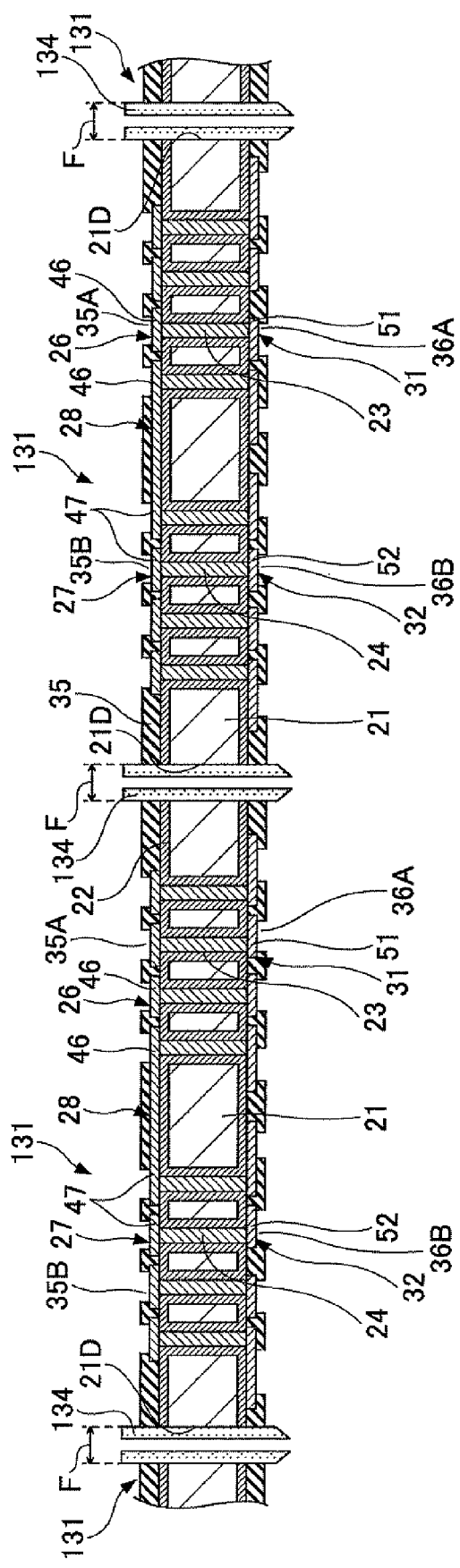
FIG. 33 is a sixth view showing the manufacturing process of the wiring board of the third embodiment of the present invention.

Next, in a step shown in FIG. 33, the dicing tape 64 and the support body 141 shown in FIG. 32 are removed and thereby plural wiring boards 131 are completely separated from each other.

Thus, according to the manufacturing method of the wiring board 131 of this embodiment, after the piercing electrodes 23 and 24, the first and second wiring patterns 26, 27, 31 and 32 and the first and second insulation resin layers 35 and 36 are formed, the groove part 143 is formed so as to pierce the cutting areas B and portions of the plural wiring forming areas A neighboring the cutting areas B. The width F of the groove part 143 is greater than the width of the cutting area B. Then, the resin 134 is formed in the groove part 143. Next, the resin 134 at parts corresponding to the cutting areas B is cut so that pieces of plural wiring boards 131 are made, and thereby the recess part 133 where the resin 134 is provided is formed at the external circumferential part of the wiring board 131.

As a result of this, it is possible to cover the entirety of the external circumferential side surface 21D of the substrate main body 21 provided at separated plural wiring boards 131 by the resin 134. With this structure, it is possible to prevent the external circumferential part of the substrate main body 21 from being damaged due to handling of the wiring board 131 (for example, handling between completion of manufacturing of the wiring board 131 and mounting of the electronic components 12 and 13 on the wiring board 131).

In this embodiment, a case where the resin 134 is formed by the printing method using the stencil mask 67 is discussed as an example. However, the present invention is not limited to this. Instead of the printing method using the stencil mask 67, the resin 134 may be formed by an ink jetting method or dispensing method. In this case, the upper surface if the first insulation resin layer 35 and the upper surface of the resin 134 can be made substantially the same.

According to the above-discussed embodiments of the present invention, it is possible to provide a wiring board, including:

a substrate main body;

a piercing electrode configured to pierce the substrate main body;

a first wiring pattern provided at a first surface side of the substrate main body, the first wiring pattern having a pad, the pad being electrically connected to one end part of the piercing electrode, the pad being where an electronic component is mounted; and a second wiring pattern provided at a second surface side of the substrate main body, the second surface side being situated at a side opposite to the first surface side, the second wiring pattern having an outside connection pad, the outside connection pad being electrically connected to another end part of the piercing electrode, wherein a first recess part and a first resin configured to cover the first recess part are provided at a corner part of the wiring board facing the first surface side so as to surround the first wiring pattern, and the first recess part is configured to notch a first corner part of the substrate main body positioned at the first surface side.

Hence, it is possible to protect, by the first resin, the first corner of the substrate main body which may be easily damaged. Therefore, it is possible to prevent the first corner part of the substrate main body from being damaged due to handling of the wiring board (for example, handling between completion of manufacturing of the wiring board and mounting of the electronic components on the wiring board).

A second recess part and second resin configured to cover the second recess part may be provided so as to surround the second wiring pattern, the second recess part being formed at a corner part of the wiring board facing the second surface side, the second recess part being configured to notch a second corner part of the substrate main body positioned at the second surface side.

With this structure, it is possible to protect, by the second resin, the second corner of the substrate main body which may be easily damaged. Therefore, it is possible to prevent the second corner part of the substrate main body from being damaged due to handling of the wiring board (for example, handling between completion of manufacturing of the wiring board and mounting of the electronic components on the wiring board).

The third resin may be provided at an external circumferential side surface of the substrate main body of a part positioned between the first recess part and the second recess part.

With this structure, it is possible to protect the external circumferential side surface of the substrate main body of the part positioned between the first recess part and the second recess part by the third resin. Therefore, it is possible to prevent the external circumferential side surface of the substrate main body from being damaged due to handling of the wiring board (for example, handling between completion of manufacturing of the wiring board and mounting of the electronic components on the wiring board).

According to the above-discussed embodiments of the present invention, it is possible to provide a wiring board, including:

a substrate main body;

a piercing electrode configured to pierce the substrate main body;

a first wiring pattern provided at a first surface side of the substrate main body, the first wiring pattern having a pad, the pad being electrically connected to one end part of the piercing electrode, the pad being where an electronic component is mounted; and a second wiring pattern provided at a second surface side of the substrate main body, the second surface side being situated at a side opposite to the first surface side, the second wiring pattern having an outside connection pad, the outside connection pad being electrically connected to another end part of the piercing electrode, wherein a recess part and a resin configured to cover the recess part are provided at an external circumferential part of the wiring board so as to surround the first wiring pattern, the second wiring pattern, and the piercing electrode, the recess part being configured to pierce the substrate main body of a part positioned at the external circumferential part of the wiring board.

Hence, it is possible to protect, by the resin, the external circumferential part (including the corner part) of the substrate main body. Therefore, it is possible to prevent the external circumferential part (including the corner part) of the substrate main body from being damaged due to handling of the wiring board (for example, handling between completion of manufacturing of the wiring board and mounting of the electronic components on the wiring board).

According to the above-discussed embodiments of the present invention, it is possible to provide a manufacturing method of a wiring board, including:

a substrate main body preparing step of preparing a substrate main body, the substrate main body having a plurality of wiring board forming areas and a plurality of cutting areas, the cutting areas being provided so as to surround the plural wiring board forming areas;

a piercing electrode and wiring pattern forming step of forming a piercing electrode, a first wiring pattern, and a second wiring pattern in the plural wiring board forming areas, the piercing electrode being configured to pierce the substrate main body, the first wiring pattern having a pad, the pad being electrically connected to one end part of the piercing electrode, the pad being where an electronic component is mounted, the second wiring pattern having an outside connection pad, the outside connection pad being electrically connected to another end part of the piercing electrode;

an insulation resin layer forming step of forming a first insulation resin layer and a second insulation resin layer, the first insulation resin layer having an opening part where the pad is exposed, the first insulation resin layer being configured to cover a part of the first wiring pattern excluding the pad, the second insulation resin layer having an opening part where the outside connection pad is exposed, the second insulation resin layer being configured to cover a part of the second wiring pattern excluding the outside connection pad;

a first groove part forming step of forming, after the insulation resin layer forming step, a first groove part in the first insulation resin layer and the substrate main body of the cutting area and portions of the plural wiring forming areas neighboring the cutting areas, the first groove part having a width greater than a width of the cutting area;

a first resin forming step of forming a first resin filling the first groove part; and a cutting step of cutting a part corresponding to the cutting area of the substrate main body, the second insulation resin layer, and the first resin filling in the first groove, so that pieces of the plural wiring boards formed in the plural wiring forming areas are made, and thereby a first recess part and the first resin configured to cover the first recess part are formed at a corner part of the wiring board positioned at a side where the first insulation resin layer is formed so as to surround the first wiring pattern, the first recess part being configured to notch a first corner part of the substrate main body.

Therefore, it is possible to prevent the first corner part of the substrate main body from being damaged due to handling of the wiring board (for example, handling between completion of manufacturing of the wiring board and mounting of the electronic components on the wiring board).

The manufacturing method of the wiring board may further include a second groove part forming step of forming, between the first resin forming step and the cutting step, a second groove part in the second insulation resin layer and the substrate main body of the cutting area and portions of the plural wiring forming areas neighboring the cutting areas, the second groove part having a width greater than a width of the cutting area; and a second resin forming step of forming a second resin filling the second groove part; wherein, in the cutting step, a part corresponding to the cutting area of the substrate main body, the first resin and the second resin may be cut, so that a second recess part is formed at a corner part of the wiring board positioned at a side where the second insulation resin layer is formed so as to surround the second wiring pattern, the second recess part being covered with the second resin, the second recess part being configured to notch a second corner part of the substrate main body.

With this structure, it is possible to prevent the second corner part of the substrate main body from being damaged due to handling of the wiring board (for example, handling between completion of manufacturing of the wiring board and mounting of the electronic components on the wiring board).

According to the above-discussed embodiments of the present invention, it is possible to provide a manufacturing method of a wiring board, comprising:

a substrate main body preparing step of preparing a substrate main body, the substrate main body having a plurality of wiring board forming areas and a plurality of cutting areas, the cutting areas being provided so as to surround the plural wiring board forming areas;

a piercing electrode and wiring pattern forming step of forming a piercing electrode, a first wiring pattern, and a second wiring pattern in the plural wiring board forming areas, the piercing electrode being configured to pierce the substrate main body, the first wiring pattern having a pad, the pad being electrically connected to one end part of the piercing electrode, the pad being where an electronic component is mounted, the second wiring pattern having an outside connection pad, the outside connection pad being electrically connected to another end part of the piercing electrode;

an insulation resin layer forming step of forming a first insulation resin layer and a second insulation resin layer, the first insulation resin layer having an opening part where the pad is exposed, the first insulation resin layer being configured to cover a part of the first wiring pattern excluding the pad, the second insulation resin layer having an opening part where the outside connection pad is exposed, the second insulation resin layer being configured to cover a part of the second wiring pattern excluding the outside connection pad;

a piercing groove part forming step of forming, after the insulation resin layer forming step, a piercing groove part in the first insulation resin layer, the second wiring pattern, and the substrate main body of the cutting area and portions of the plural wiring forming areas neighboring the cutting areas, the piercing groove part having a width greater than a width of the cutting area;

a resin forming step of forming a resin filling the piercing groove part; and a cutting step of cutting a part corresponding to the cutting area of the resin, so that pieces of the plural wiring boards are made, and thereby a recess part is formed at the external circumferential part of the wiring board so as to surround the first and the second wiring patterns and the piercing electrode, the recess part being covered with the resin.

Hence, it is possible to protect, by the resin, the external circumferential part (including the corner part) of the substrate main body. Therefore, it is possible to prevent the external circumferential part (including the corner part) of the substrate main body from being damaged due to handling of the wiring board (for example, handling between completion of manufacturing of the wiring board and mounting of the electronic components on the wiring board).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A wiring board, comprising:
   a substrate main body;
   a piercing electrode configured to pierce the substrate main body;
   a first wiring pattern provided at a first surface side of the substrate main body, the first wiring pattern being electrically connected to one end part of the piercing electrode, the first wiring pattern having a pad, the pad being where an electronic component is mounted;
   a second wiring pattern provided at a second surface side of the substrate main body, the second surface side being situated at a side opposite to the first surface side, the second wiring pattern being electrically connected to another end part of the piercing electrode, the second wiring pattern having an external connection pad; and
a first insulation resin layer provided at the first surface side of the substrate main body and configured to cover a part of the first wiring pattern excluding the pad, the first insulation resin layer having an opening part where the pad is exposed;
wherein a first recess part and a first resin configured to cover the first recess part are provided at a corner part of the wiring board facing the first surface side so as to surround the first wiring pattern, and the first recess part is formed in the substrate main body and the first insulation resin layer and configured to notch a first corner part of the substrate main body positioned at the first surface side;
wherein the first resin is exposed at an upper surface of the first insulation resin layer.

2. The wiring board as claimed in claim 1,
wherein a second recess part and a second resin configured to cover the second recess part are provided so as to surround the second wiring pattern, the second recess part being formed at a corner part of the wiring board facing the second surface side, and the second recess part is configured to notch a second corner part of the substrate main body positioned at the second surface side.

3. The wiring board as claimed in claim 1,
wherein a third resin is provided at an external circumferential side surface of the substrate main body of a part positioned between the first recess part and the second recess part.

4. The wiring board as claimed in claim 1, further comprising:
a second insulation resin layer having an opening part where the external connection pad is exposed, the second insulation resin layer being configured to cover a part of the second wiring pattern excluding the external connection pad.

5. The wiring board as claimed in claim 1, wherein the first resin projects from the upper surface of the first insulation resin layer.

6. The wiring board as claimed in claim 1,
wherein the first recess part includes a lower end and side surfaces,
wherein a part of the upper surface of the substrate main body constitutes the lower end of the first recess part,
wherein a part of a side surface of the substrate main body and a part of a side surface of the first insulation resin layer constitute the side surfaces of the first recess part,
wherein the first resin is formed, so that the first resin covers the part of the upper surface of the substrate main body, the part of the side surface of the substrate main body, and the part of the side surface of the first insulation resin layer.

7. The wiring board as claimed in claim 1, wherein the first insulation resin layer is a solder resist layer.

8. The wiring board as claimed in claim 1, wherein the first resin is formed of epoxy resin, polyimide resin, or silicone resin.

9. The wiring board as claimed in claim 1, wherein the substrate main body is formed of a silicon substrate or a glass substrate.

* * * * *